United States Patent
Hung et al.

(10) Patent No.: US 11,444,080 B2
(45) Date of Patent: Sep. 13, 2022

(54) SEMICONDUCTOR STRUCTURE CUTTING PROCESS AND STRUCTURES FORMED THEREBY

(71) Applicant: Taiwan Semiconductor Manufacturing Co., Ltd., Hsinchu (TW)

(72) Inventors: Chih-Chang Hung, Hsinchu (TW); Chia-Jen Chen, Chiaya (TW); Ming-Ching Chang, Hsinchu (TW); Shu-Yuan Ku, Zhubei (TW); Yi-Hsuan Hsiao, Taipei (TW); I-Wei Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 95 days.

(21) Appl. No.: 17/085,121

(22) Filed: Oct. 30, 2020

(65) Prior Publication Data
US 2021/0050350 A1     Feb. 18, 2021

Related U.S. Application Data

(60) Continuation of application No. 16/407,730, filed on May 9, 2019, now Pat. No. 10,833,077, which is a
(Continued)

(51) Int. Cl.
*H01L 27/088*     (2006.01)
*H01L 21/311*     (2006.01)
(Continued)

(52) U.S. Cl.
CPC ........ *H01L 27/0886* (2013.01); *H01L 21/283* (2013.01); *H01L 21/31116* (2013.01);
(Continued)

(58) Field of Classification Search
CPC .................................................. H01L 27/0866
See application file for complete search history.

(56) References Cited

U.S. PATENT DOCUMENTS

| 9,735,157 B1 | 8/2017 | Chun et al. |
| 2016/0118462 A1 | 4/2016 | Tseng et al. |
| 2016/0336320 A1 | 11/2016 | Lin |

FOREIGN PATENT DOCUMENTS

| KR | 100843900 B1 | 7/2008 |
| KR | 20160112905 A | 9/2016 |

(Continued)

*Primary Examiner* — John A Bodnar
(74) *Attorney, Agent, or Firm* — Slater Matsil, LLP

(57) ABSTRACT

Methods of cutting gate structures, and structures formed, are described. In an embodiment, a structure includes first and second gate structures over an active area, and a gate cut-fill structure. The first and second gate structures extend parallel. The active area includes a source/drain region disposed laterally between the first and second gate structures. The gate cut-fill structure has first and second primary portions and an intermediate portion. The first and second primary portions abut the first and second gate structures, respectively. The intermediate portion extends laterally between the first and second primary portions. First and second widths of the first and second primary portions along longitudinal midlines of the first and second gate structures, respectively, are each greater than a third width of the intermediate portion midway between the first and second gate structures and parallel to the longitudinal midline of the first gate structure.

20 Claims, 53 Drawing Sheets

Related U.S. Application Data division of application No. 15/860,492, filed on Jan. 2, 2018, now Pat. No. 10,867,998.

(60) Provisional application No. 62/591,898, filed on Nov. 29, 2017.

(51) Int. Cl.
| | |
|---|---|
| *H01L 21/3213* | (2006.01) |
| *H01L 21/762* | (2006.01) |
| *H01L 21/8234* | (2006.01) |
| *H01L 29/06* | (2006.01) |
| *H01L 29/08* | (2006.01) |
| *H01L 29/423* | (2006.01) |
| *H01L 29/49* | (2006.01) |
| *H01L 29/66* | (2006.01) |
| *H01L 21/283* | (2006.01) |
| *H01L 29/78* | (2006.01) |
| *H01L 21/02* | (2006.01) |
| *H01L 21/3105* | (2006.01) |
| *H01L 21/321* | (2006.01) |

(52) U.S. Cl.
CPC .. *H01L 21/32136* (2013.01); *H01L 21/76224* (2013.01); *H01L 21/823431* (2013.01); *H01L 21/823437* (2013.01); *H01L 21/823481* (2013.01); *H01L 29/0649* (2013.01); *H01L 29/0847* (2013.01); *H01L 29/42376* (2013.01); *H01L 29/49* (2013.01); *H01L 29/4991* (2013.01); *H01L 29/66545* (2013.01); *H01L 29/66636* (2013.01); *H01L 29/78* (2013.01); *H01L 21/02068* (2013.01); *H01L 21/31053* (2013.01); *H01L 21/31144* (2013.01); *H01L 21/3212* (2013.01); *H01L 21/32139* (2013.01); *H01L 29/6656* (2013.01)

(56) References Cited

FOREIGN PATENT DOCUMENTS

| | | |
|---|---|---|
| KR | 20160134442 A | 11/2016 |
| KR | 20170108765 A | 9/2017 |

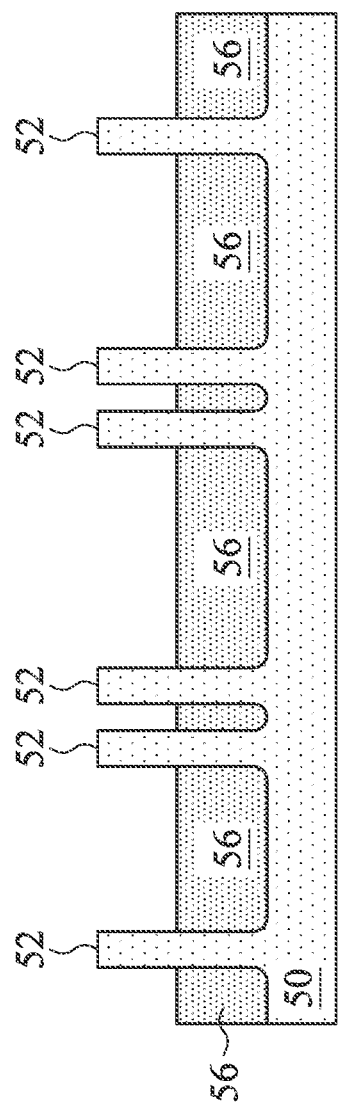
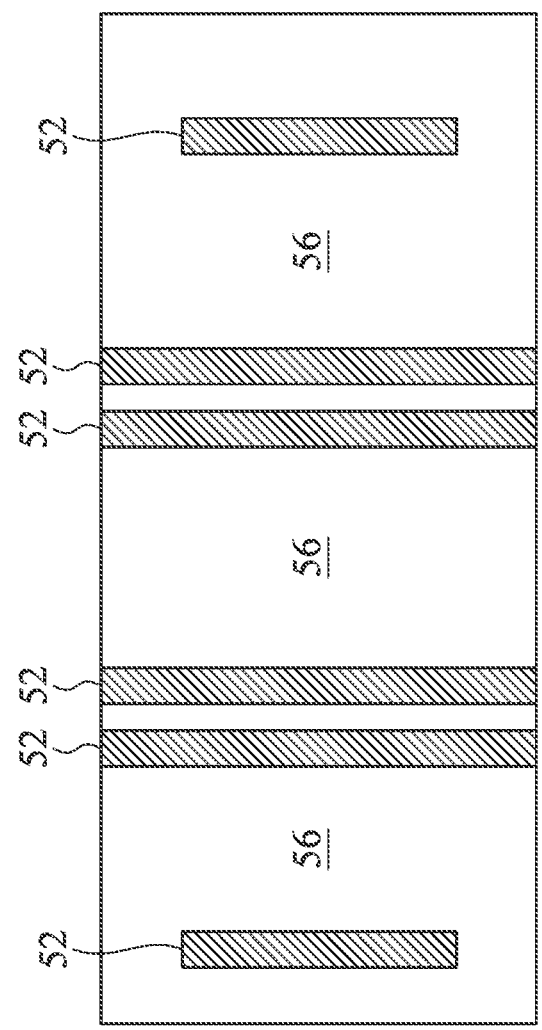
FIG. 3A
FIG. 3B

SEMICONDUCTOR STRUCTURE CUTTING PROCESS AND STRUCTURES FORMED THEREBY

PRIORITY CLAIM AND CROSS-REFERENCE

This application is a continuation of U.S. application Ser. No. 16/407,730, filed on May 9, 2019, entitled "Semiconductor Structure Cutting Process and Structures Formed Thereby," which is a divisional of U.S. application Ser. No. 15/860,492, filed on Jan. 2, 2018, entitled "Semiconductor Structure Cutting Process and Structures Formed Thereby," which claims the benefit of and priority to U.S. Provisional Application No. 62/591,898, filed on Nov. 29, 2017, entitled "Semiconductor Structure Cutting Process and Structures Formed Thereby," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3A-B, 4A-C, 5A-E, 6A-E, 7A-E, 8A-E, 9A-E, 10A-E, 11A-E, 12A-E, 13A-E, and 14A-E are various views of respective intermediate structures at intermediate stages in an example process of forming a semiconductor device including one or more Fin Field Effect Transistors (FinFETs) in accordance with some embodiments.

DETAILED DESCRIPTION

Figure 1:
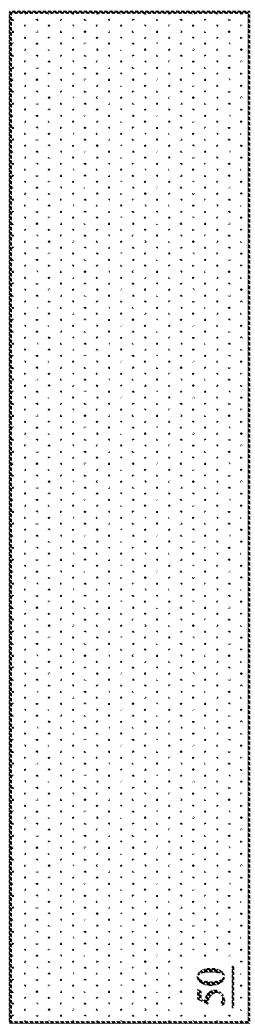

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of cutting gate structures in a semiconductor device, such as including a Fin Field-Effect Transistor (FinFET), and structures formed thereby are described herein. Generally, gate structures, such as replacement gate structures in a replacement gate process, are cut using an etching process. The etching process can include an anisotropic etching and an isotropic etching, and the isotropic etching can etch conductive material of the gate structures, e.g., a gate electrode, faster than a dielectric material in a surrounding dielectric layer, such as an interlayer dielectric (ILD), is etched. This etching process can create a cut opening through the conductive material of the gate structures that has a profile that has a width between cut sections of the gate structures that is greater than a width of the cut opening in the surrounding dielectric layer. The smaller width of the cut opening in the surrounding dielectric layer may permit a greater distance between the cut opening and epitaxy source/drain regions, which can reduce a risk of damage to the epitaxy source/drain regions. Other advantages may be realized.

Example embodiments described herein are described in the context of FinFETs. Implementations of some aspects of the present disclosure may be used in other processes and/or in other devices, such as planar FETs. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1, 2, 3A-B, 4A-C, and 5A-E through 14A-E are various views of respective intermediate structures during intermediate stages in an example process of forming a semiconductor device including one or more FinFETs in accordance with some embodiments. In some figures, some reference numbers of components or features illustrated therein may be omitted to avoid obscuring other components or features; this is for ease of depicting the figures.

FIG. 1 illustrates, in a cross-sectional view, a semiconductor substrate 50. The semiconductor substrate 50 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor such as silicon (Si) and germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 2:
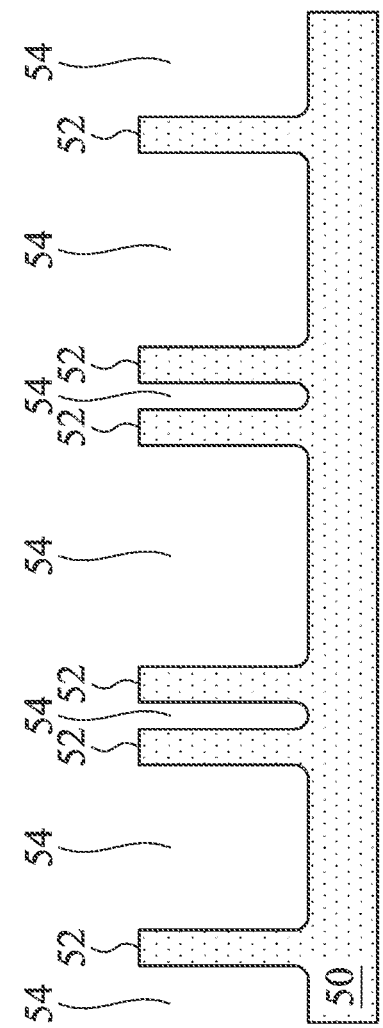

FIG. 2 illustrates, in a cross-sectional view, the formation of fins 52 in the semiconductor substrate 50. In some examples, a mask (e.g., a hard mask) is used in forming the fins 52. For example, one or more mask layers are deposited over the semiconductor substrate 50, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etching process, which forms the mask. The etching process may include a reactive ion etch (RIE), neutral beam etch (NBE), inductive coupled plasma (ICP) etch, the like, or a combination thereof. The etching process may be anisotropic. Subsequently, the photo resist is removed in an ashing or wet strip processes, for example.

Using the mask, the semiconductor substrate 50 may be etched such that trenches 54 are formed between neighboring pairs of fins 52 and such that the fins 52 protrude from the semiconductor substrate 50. The etching process may include a RIE, NBE, ICP etch, the like, or a combination thereof. The etching process may be anisotropic.

FIGS. 3A and 3B illustrate, in a cross-sectional view and top view, respectively, the formation of isolation regions 56, each in a corresponding trench 54. The isolation regions 56 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 56 include silicon oxide that is formed by a FCVD process. A planarization process, such as a Chemical Mechanical Polish (CMP), may remove any excess insulating material and any remaining mask (e.g., used to etch the trenches and form the fins 52) to form top surfaces of the insulating material and top surfaces of the fins 52 to be coplanar. The insulating material may then be recessed to form the isolation regions 56. The insulating material is recessed such that the fins 52 protrude from between neighboring isolation regions 56, which may, at least in part, thereby delineate the fins 52 as active areas on the semiconductor substrate 50. The insulating material may be recessed using an acceptable etching process, such as one that is selective to the material of the insulating material, which may be a wet etching process and/or a dry etching process. Further, top surfaces of the isolation regions 56 may have a flat surface as illustrated, a convex surface, a concave surface (such as dishing), or a combination thereof, which may result from an etching process. As illustrated in the top view of FIG. 3B, the fins 52 extend longitudinally across the semiconductor substrate 50.

A person having ordinary skill in the art will readily understand that the processes described with respect to FIGS. 1 through 3A-B are just examples of how fins 52 may be formed. In other embodiments, a dielectric layer can be formed over a top surface of the semiconductor substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 52 can be recessed (e.g., after planarizing the insulating material of the isolation regions 56 and before recessing the insulating material), and a material different from the fins may be epitaxially grown in their place. In an even further embodiment, a dielectric layer can be formed over a top surface of the semiconductor substrate 50; trenches can be etched through the dielectric layer; heteroepitaxial structures can be epitaxially grown in the trenches using a material different from the semiconductor substrate 50; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

Figure 4A:
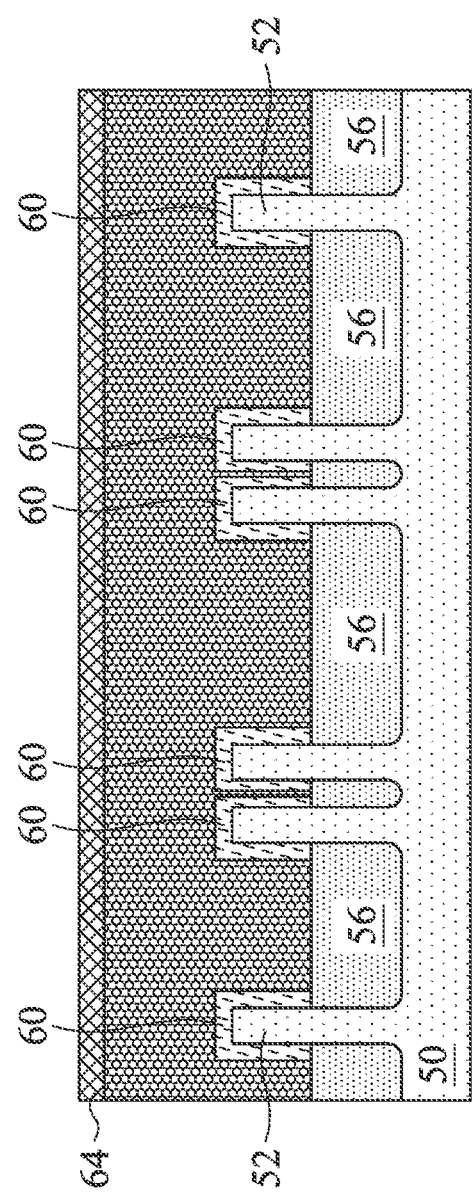
Figure 4B:
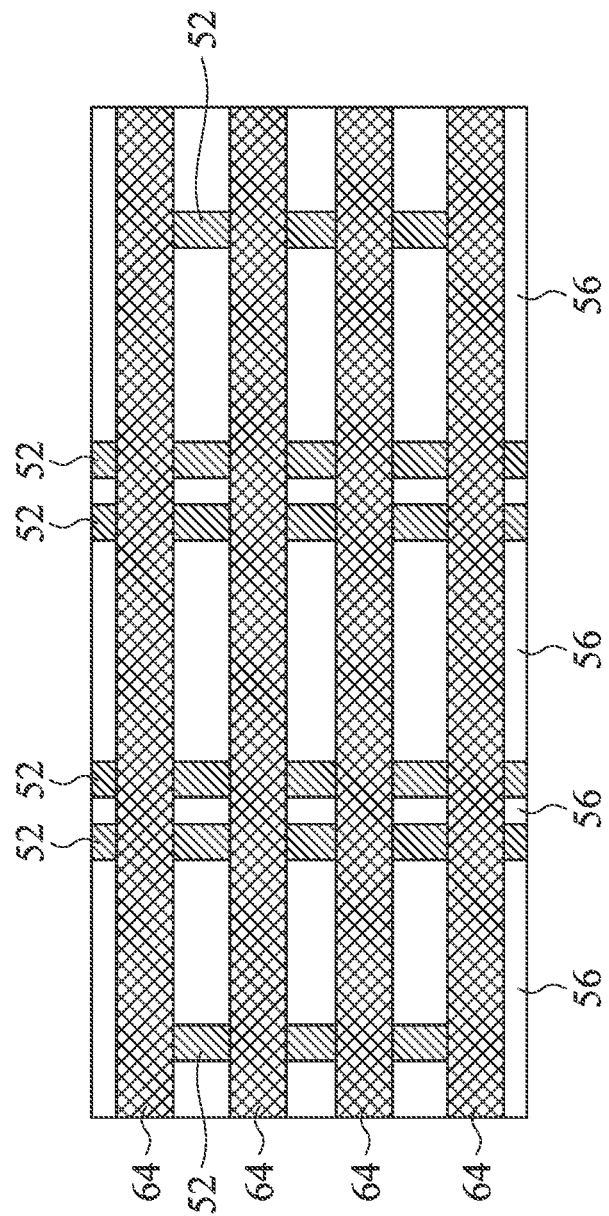
Figure 4C:
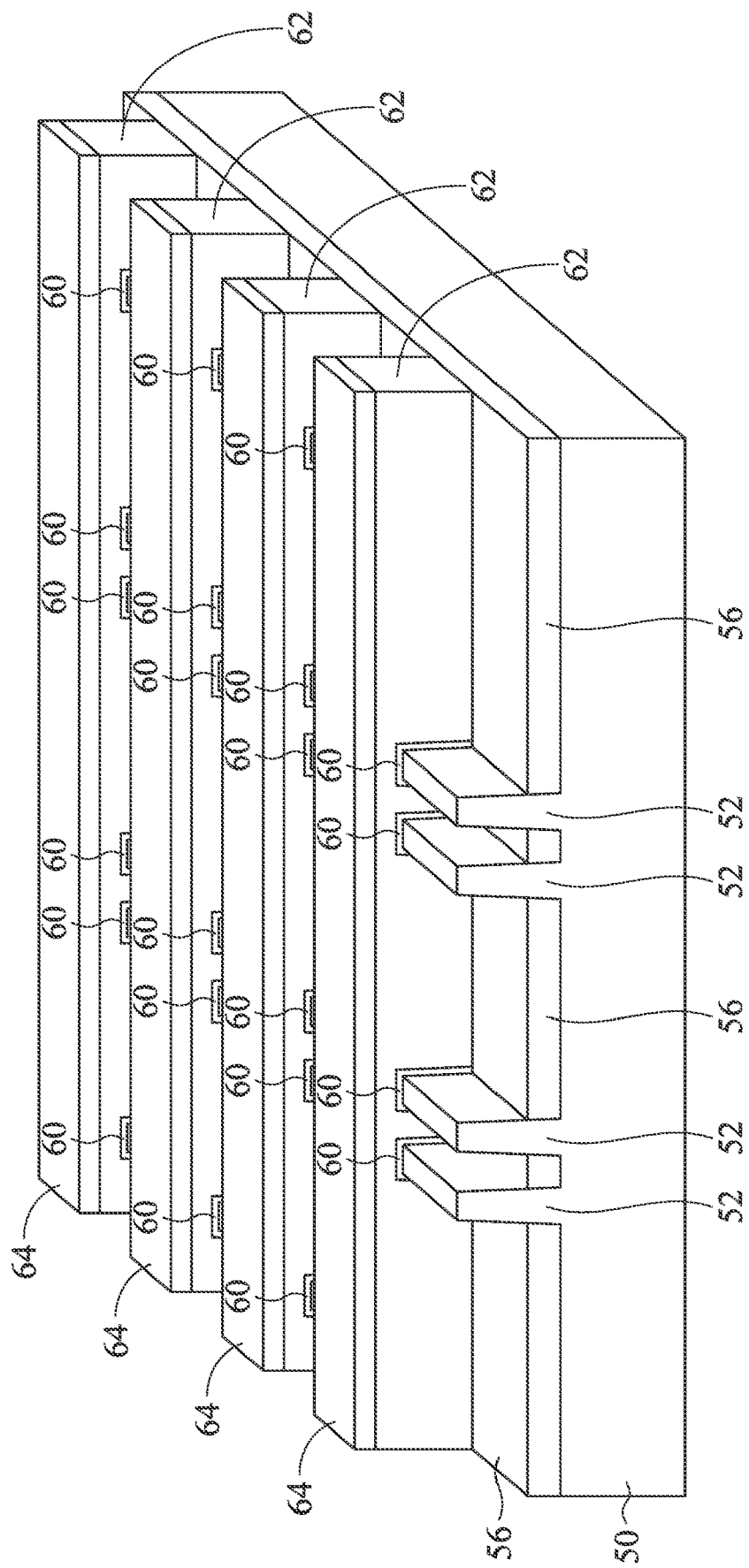

FIGS. 4A, 4B, and 4C illustrate, in a cross-sectional view, top view, and perspective three-dimensional view, respectively, the formation of dummy gate stacks (or more generally, gate structures) on the fins 52. The dummy gate stacks are over and extend laterally perpendicularly to the fins 52. Each dummy gate stack comprises one or more interfacial dielectrics 60, a dummy gate 62, and a mask 64. The one or more interfacial dielectrics 60, dummy gates 62, and mask 64 for the dummy gate stacks may be formed by sequentially forming respective layers, and then patterning those layers into the dummy gate stacks. For example, a layer for the one or more interfacial dielectrics 60 may include or be silicon oxide, silicon nitride, the like, or multilayers thereof, and may be thermally and/or chemically grown on the fins 52, as illustrated, or conformally deposited, such as by plasma-enhanced CVD (PECVD), ALD, or another deposition technique. A layer for the dummy gates 62 may include or be silicon (e.g., polysilicon) or another material deposited by CVD, PVD, or another deposition technique. A layer for the mask 64 may include or be silicon nitride, silicon oxynitride, silicon carbon nitride, the like, or a combination thereof, deposited by CVD, PVD, ALD, or another deposition technique. The layers for the mask 64, dummy gates 62, and one or more interfacial dielectrics 60 may then be patterned, for example, using photolithography and one or more etching processes, like described above, to form the mask 64, dummy gate 62, and one or more interfacial dielectrics 60 for each dummy gate stack.

In the illustrated example, a dummy gate stack is implemented for a replacement gate process. In other examples, a gate-first process may be implemented using gate stacks including, for example, a gate dielectric layer in the place of the one or more interfacial dielectrics 60, and a gate electrode in the place of the dummy gate 62. In some gate-first processes, the gate stacks may be formed using similar processes and materials as described with respect to the dummy gate stacks; although in other examples, other processes or materials may be implemented. For example, a gate dielectric layer may include or be a high-k dielectric material, such as having a k value greater than about 7.0, which may include a metal oxide or silicate of Hf, Al, Zr, La, Mg, Ba, Ti, Pb, multilayers thereof, or a combination thereof. A gate dielectric layer may also be deposited by molecular-beam deposition (MBD), ALD, PECVD, or another deposition technique. A gate electrode may also include or be a metal-containing material such as TiN, TaN, TaC, Co, Ru, Al, multi-layers thereof, or a combination thereof, and may also be deposited by CVD, PVD, or another deposition technique.

In some embodiments, after forming the dummy gate stacks, lightly doped drain (LDD) regions (not specifically illustrated) may be formed in the fins 52. For example, dopants for the LDD regions may be implanted into the fins 52 using the dummy gate stacks as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 5A:
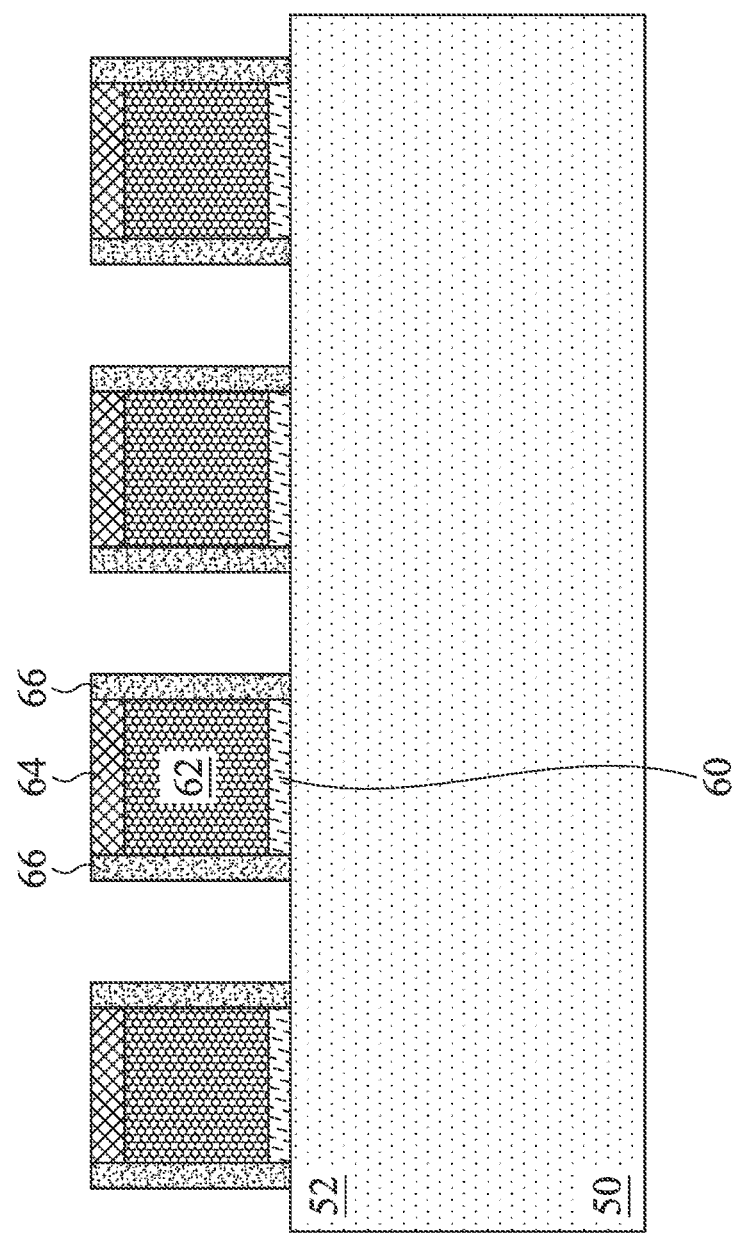
Figure 5B:
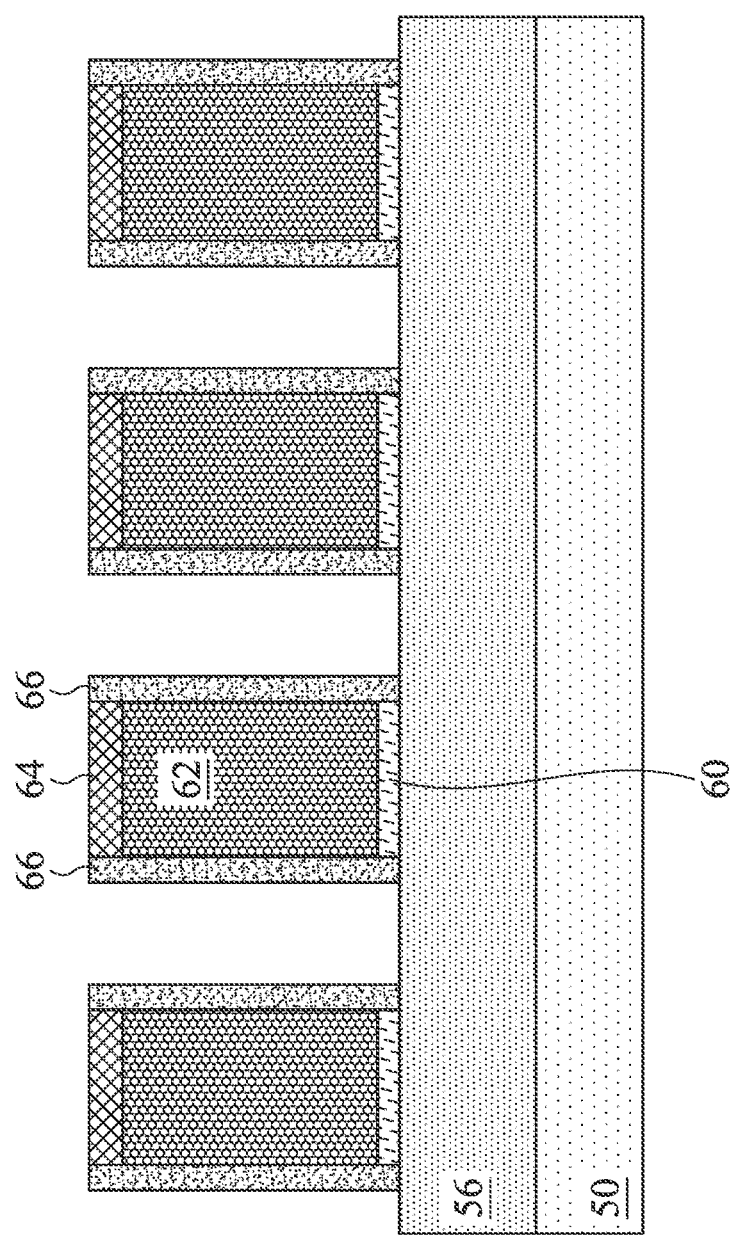
Figure 5C:
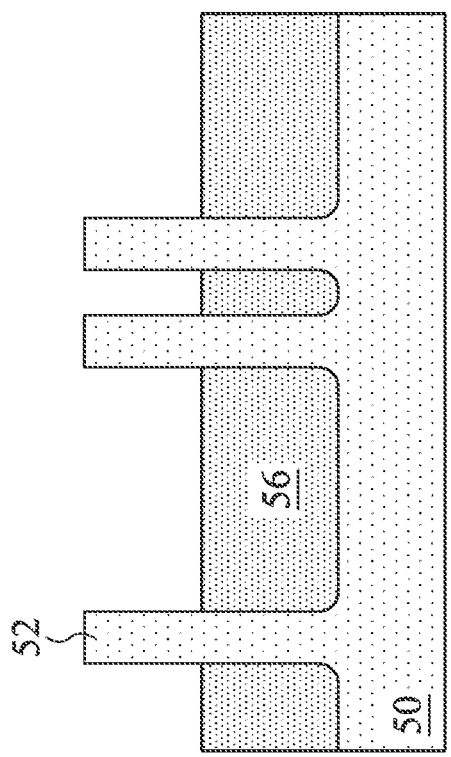
Figure 5D:
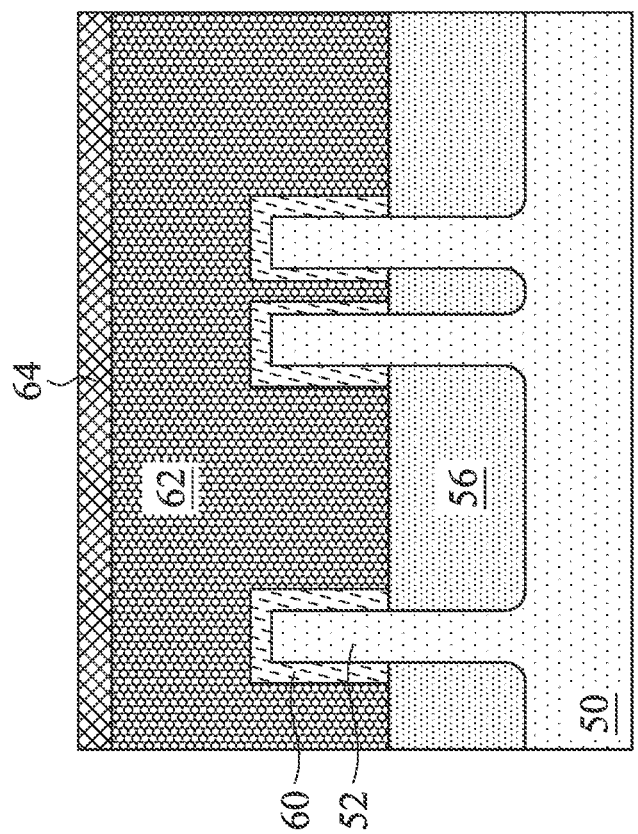
Figure 5E:
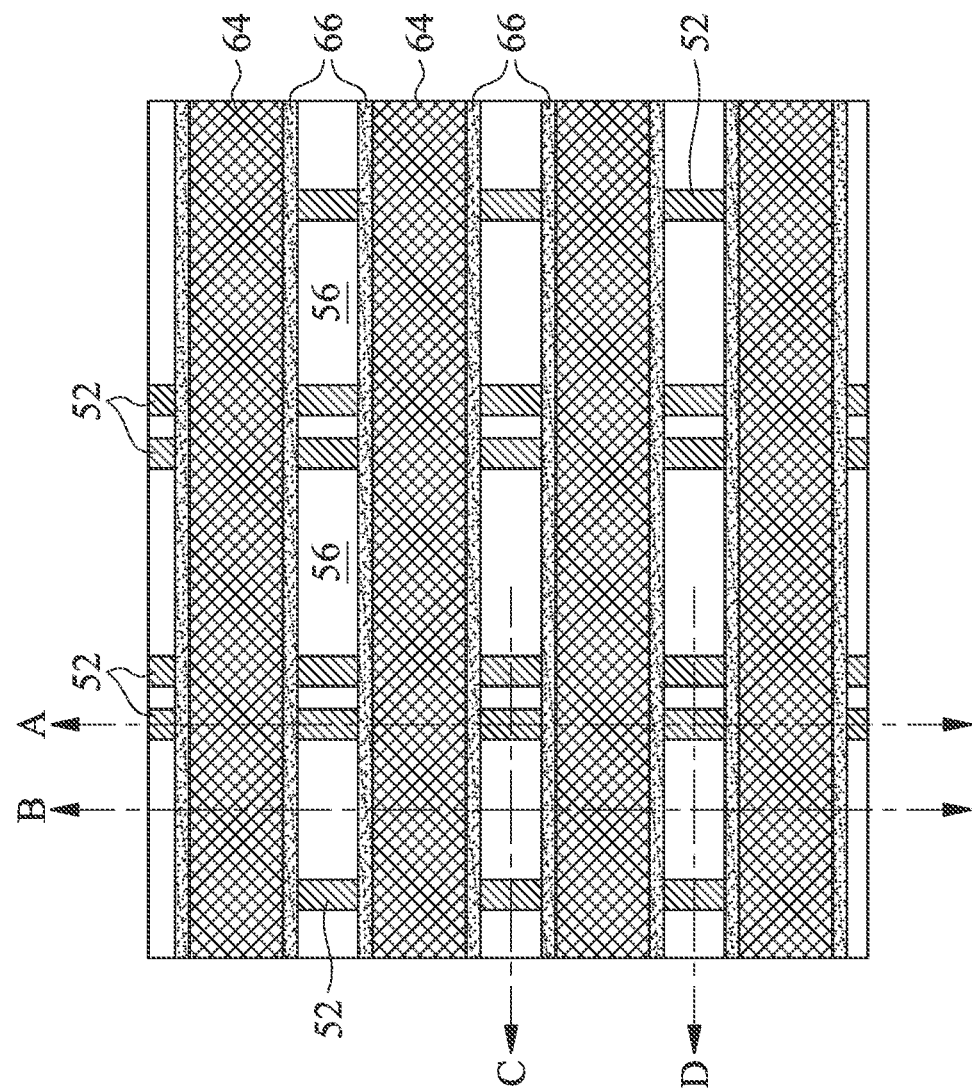
Figure 6A:
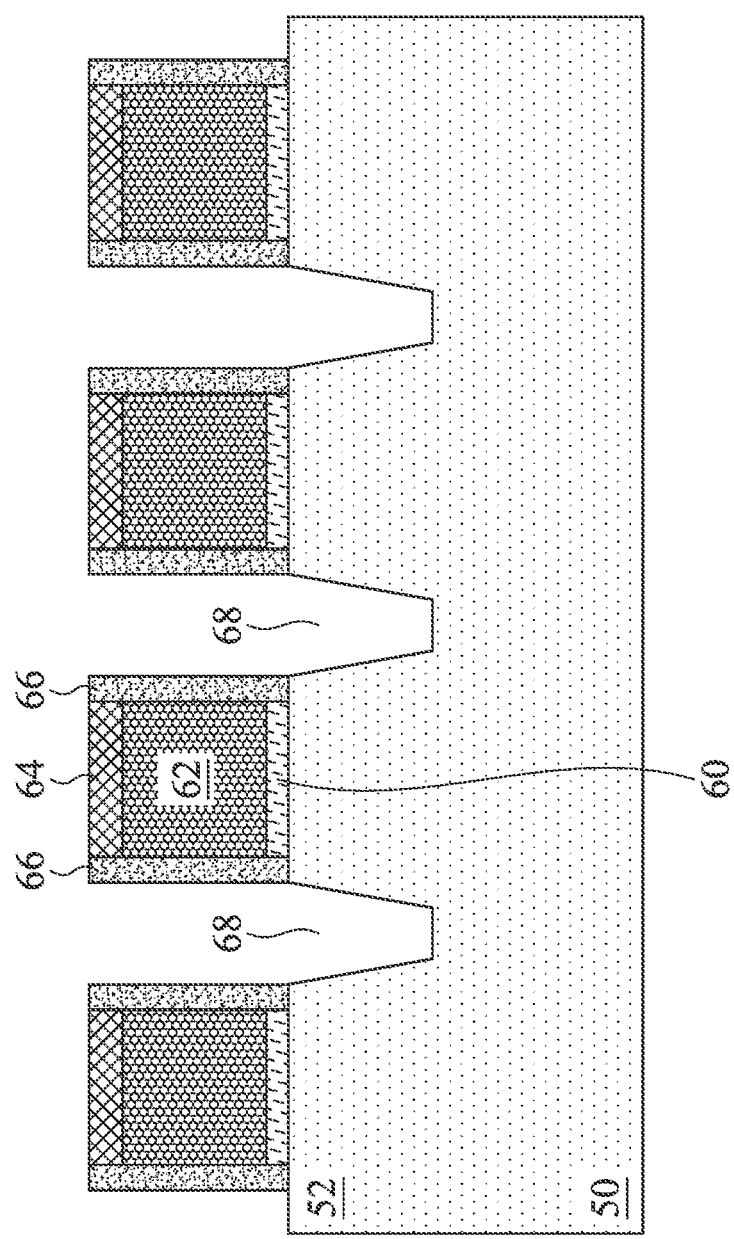
Figure 6B:
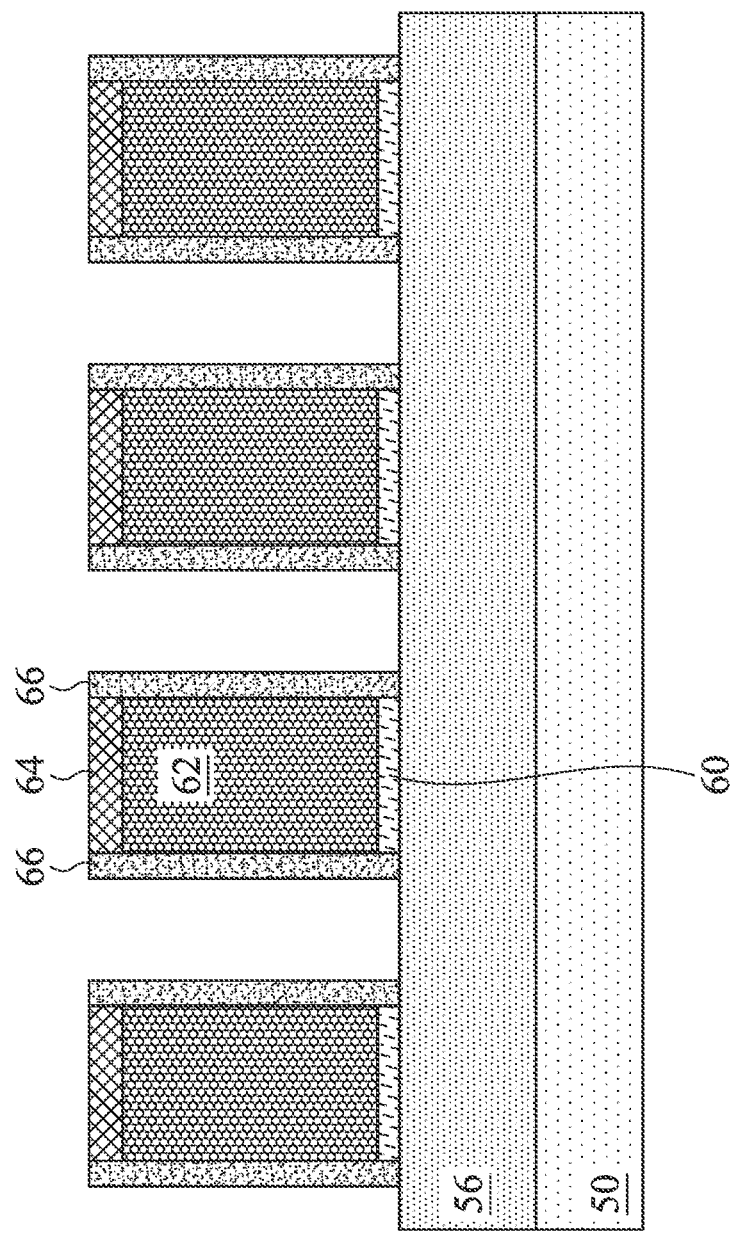
Figure 6D:
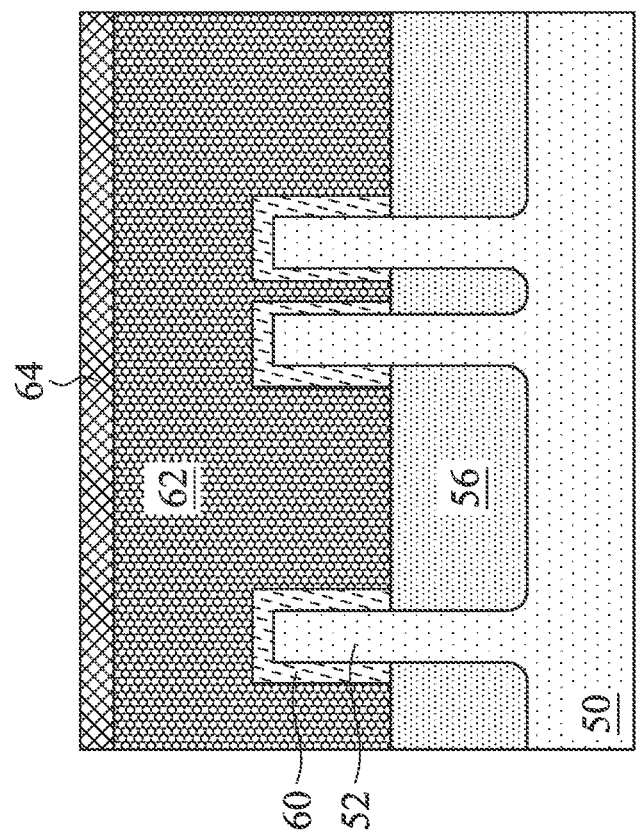
Figure 6C:
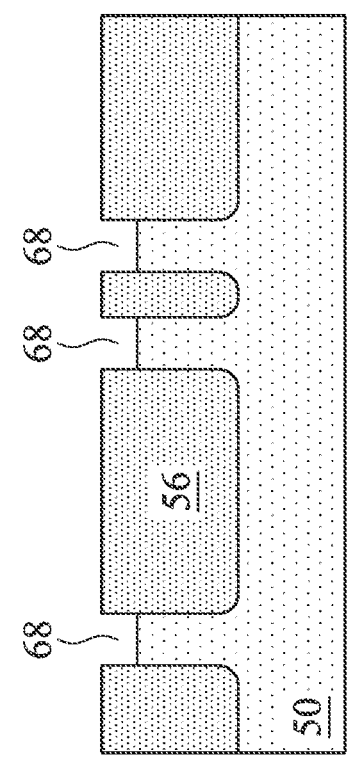
Figure 6E:
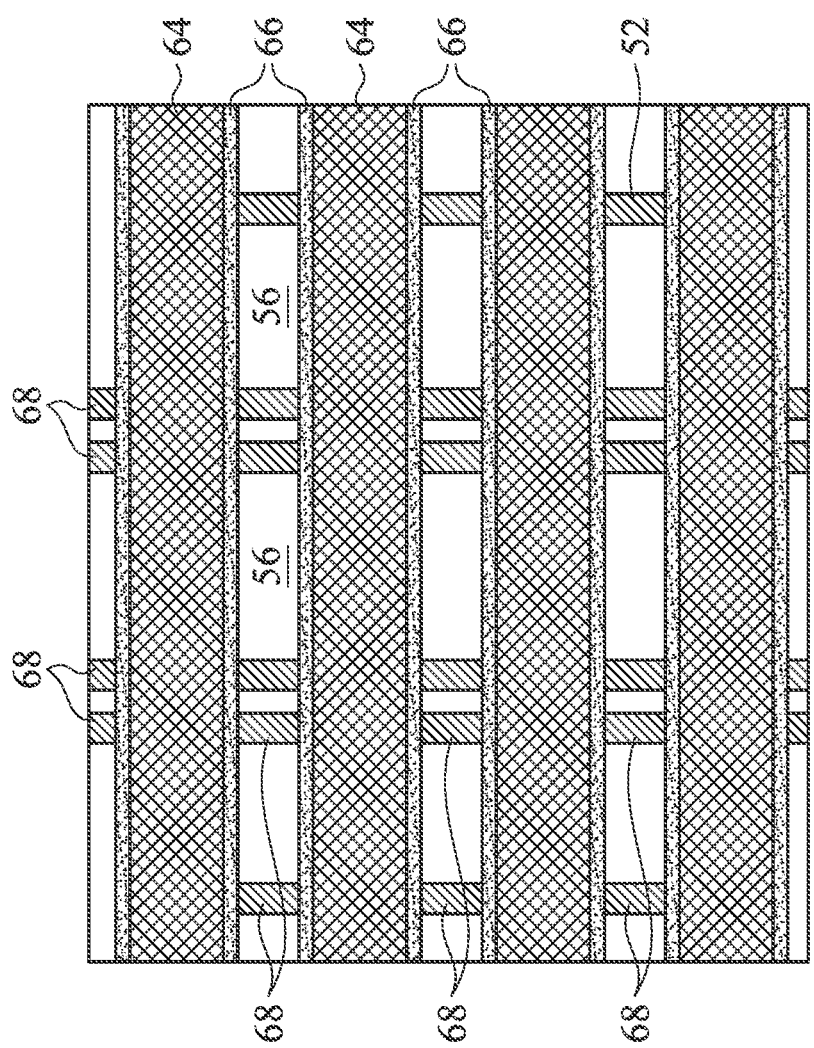

FIGS. 5A, 5B, 5C, 5D, and 5E illustrate the formation of gate spacers 66 along sidewalls of the dummy gate stacks. FIG. 5E illustrates a top view with cross-sections A-A, B-B, C, and D. FIG. 5A, and the following figures ending with an "A" designation illustrate cross-sectional views at various instances of processing corresponding to cross-section A-A. FIG. 5B and the following figures ending with a "B" designation illustrate cross-sectional views at various instances of processing corresponding to cross-section B-B. FIG. 5C and the following figures ending with a "C" designation illustrate cross-sectional views at various instances of processing corresponding to cross-section C. FIG. 5D and the following figures ending with a "D" designation illustrate cross-sectional views at various instances of processing corresponding to cross-section D. FIG. 5D is a partial cross-sectional view corresponding to the cross-sectional views of FIGS. 1, 2, 3A, and 4A at different instances of processing. FIG. 5E is a top view corresponding to the top views of FIGS. 3B and 4B at different instances of processing.

The cross-section A-A is along a fin 52 (e.g., along a channel direction in the fin 52). The cross-section B-B is parallel to cross-section A-A between fins 52 and intersects dummy gate stacks where a gate cut will be made in subsequent figures and description. The cross-section C is across fins 52 (e.g., in source/drain regions) and is a partial cross-section of the structure illustrated in a top view in FIG. 5E. The cross-section D is along a dummy gate stack where a gate cut will be made in subsequent figures and description, and is a partial cross-section of the structure illustrated in a top view in FIG. 5E. The cross-section D is parallel to cross-section C. Cross-sections A-A and B-B are perpendicular to cross-sections C and D.

Gate spacers 66 are formed along sidewalls of the dummy gate stacks (e.g., sidewalls of the one or more interfacial dielectrics 60, dummy gate 62, and mask 64) and over the fins 52. The gate spacers 66 may be formed by conformally depositing one or more layers for the gate spacers 66 and anisotropically etching the one or more layers, for example. The one or more layers for the gate spacers 66 may include or be silicon carbon oxide, silicon nitride, silicon oxynitride, silicon carbon nitride, the like, multi-layers thereof, or a combination thereof, and may be deposited by CVD, ALD, or another deposition technique. The etching process can include a RIE, NBE, or another etching process.

FIGS. 6A, 6B, 6C, 6D, and 6E illustrate the formation of recesses 68 for source/drain regions. As illustrated, the recesses 68 are formed in the fins 52 on opposing sides of the dummy gate stacks. The recessing can be by an etching process. The etching process can be isotropic or anisotropic, or further, may be selective with respect to one or more crystalline planes of the semiconductor substrate 50. Hence, the recesses 68 can have various cross-sectional profiles based on the etching process implemented. The etching process may be a dry etch, such as a RIE, NBE, or the like, or a wet etch, such as using tetramethylammonium hydroxide (TMAH), ammonium hydroxide (NH$_4$OH), or another etchant.

Figure 7A:
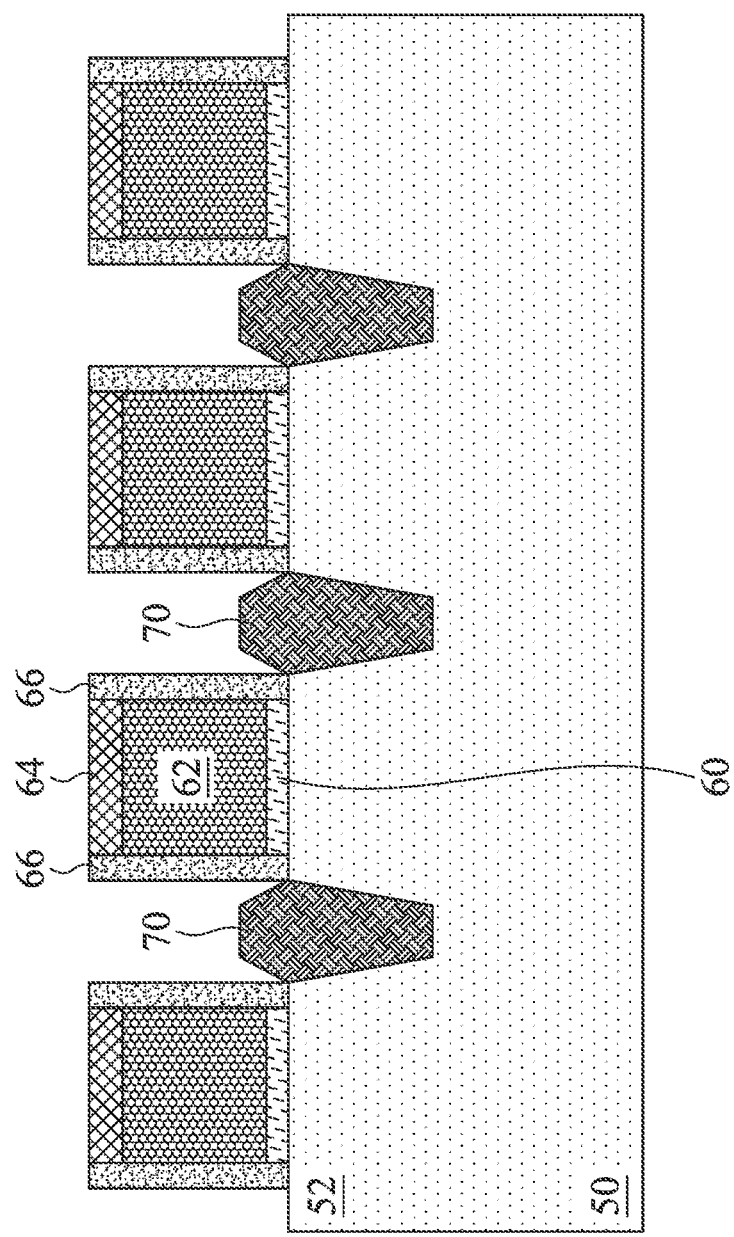
Figure 7B:
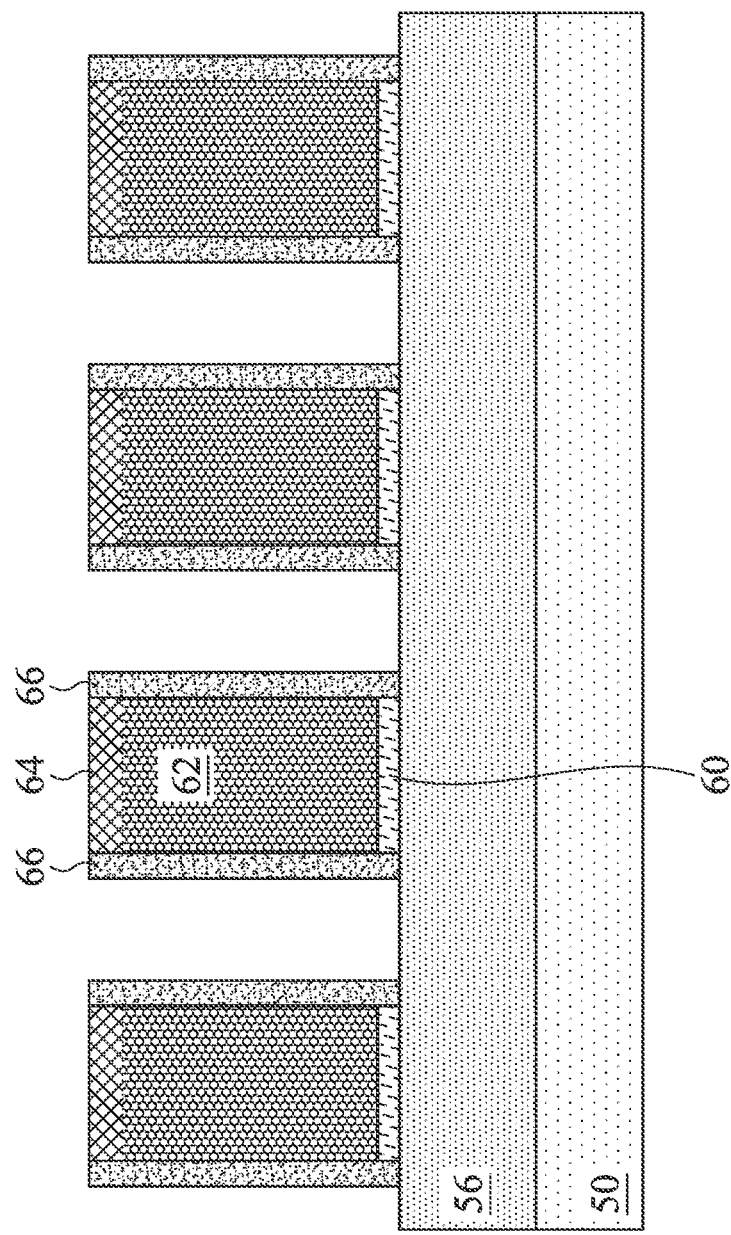
Figure 7D:
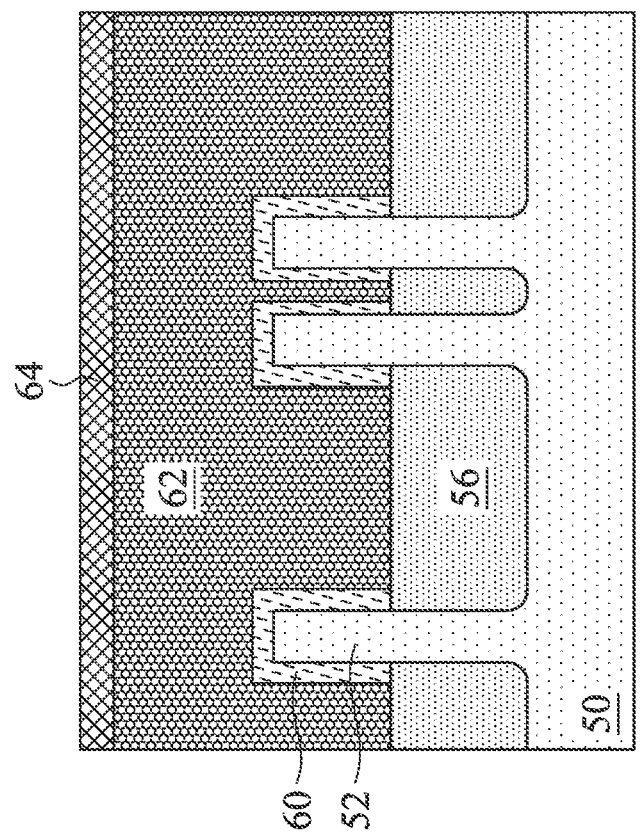
Figure 7C:
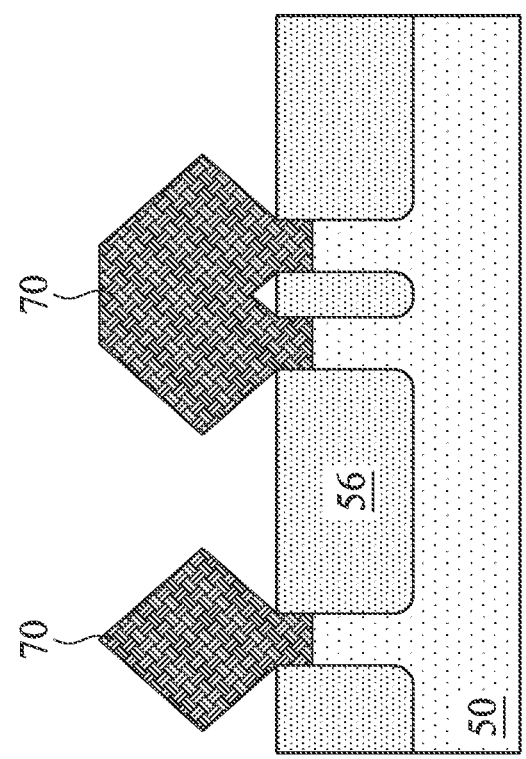
Figure 7E:
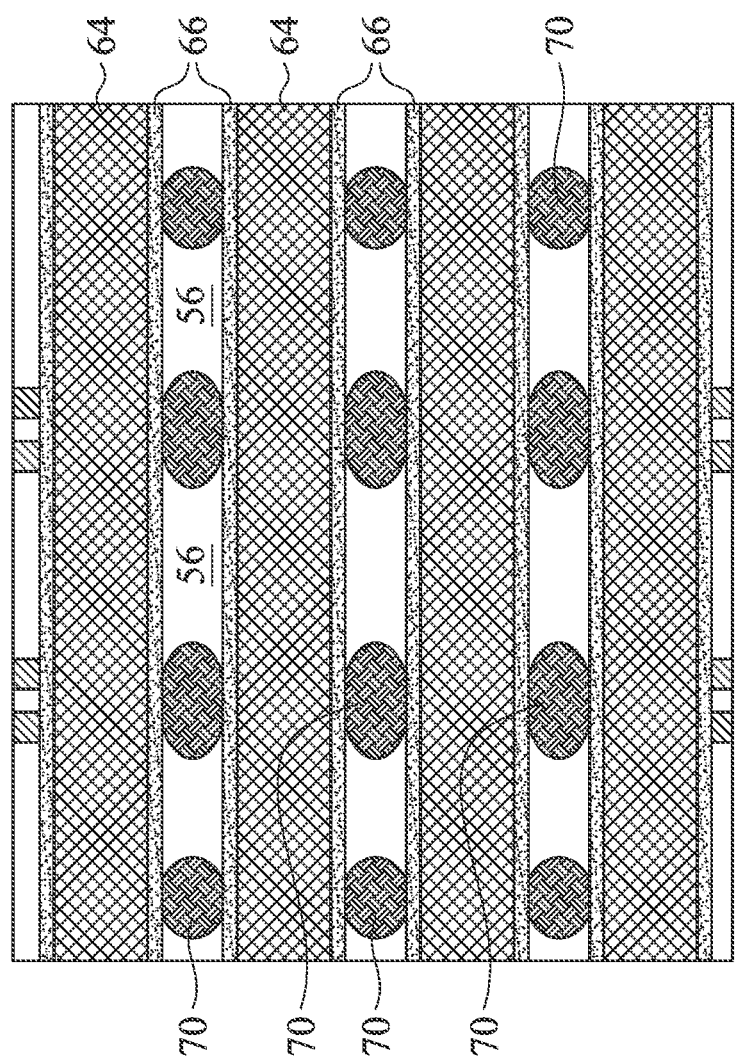
Figure 8A:
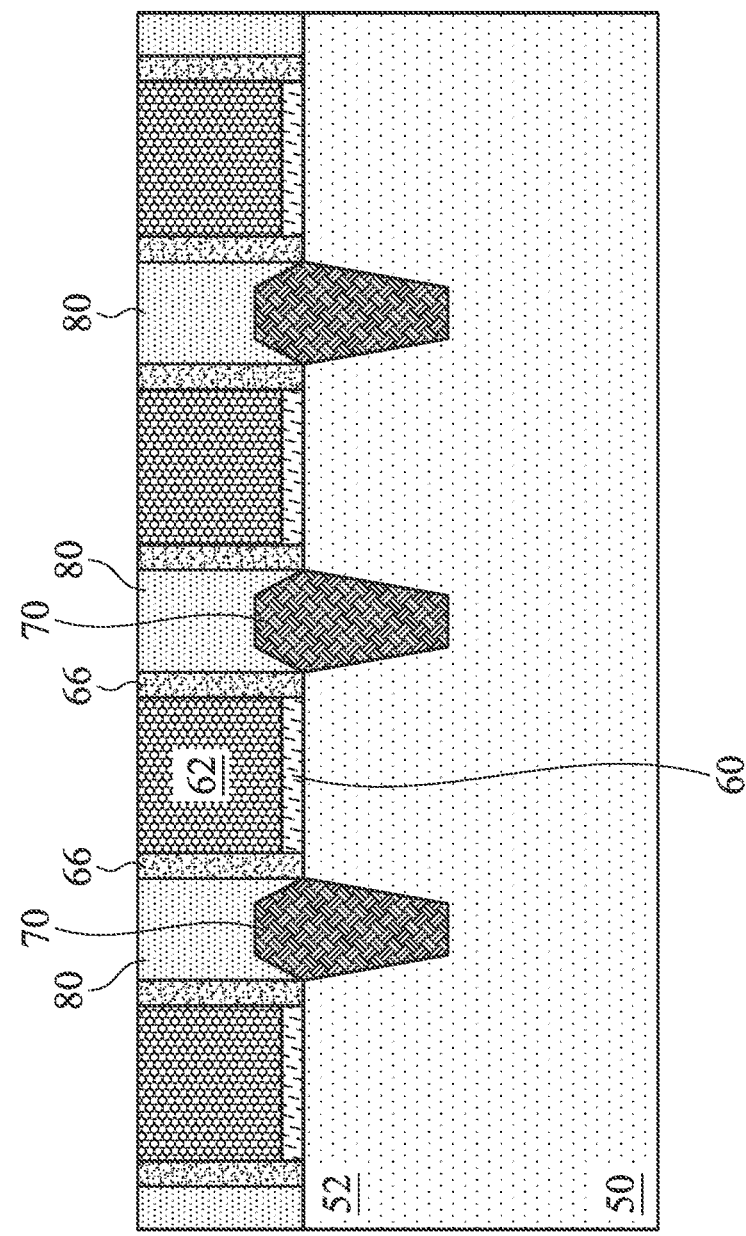
Figure 8B:
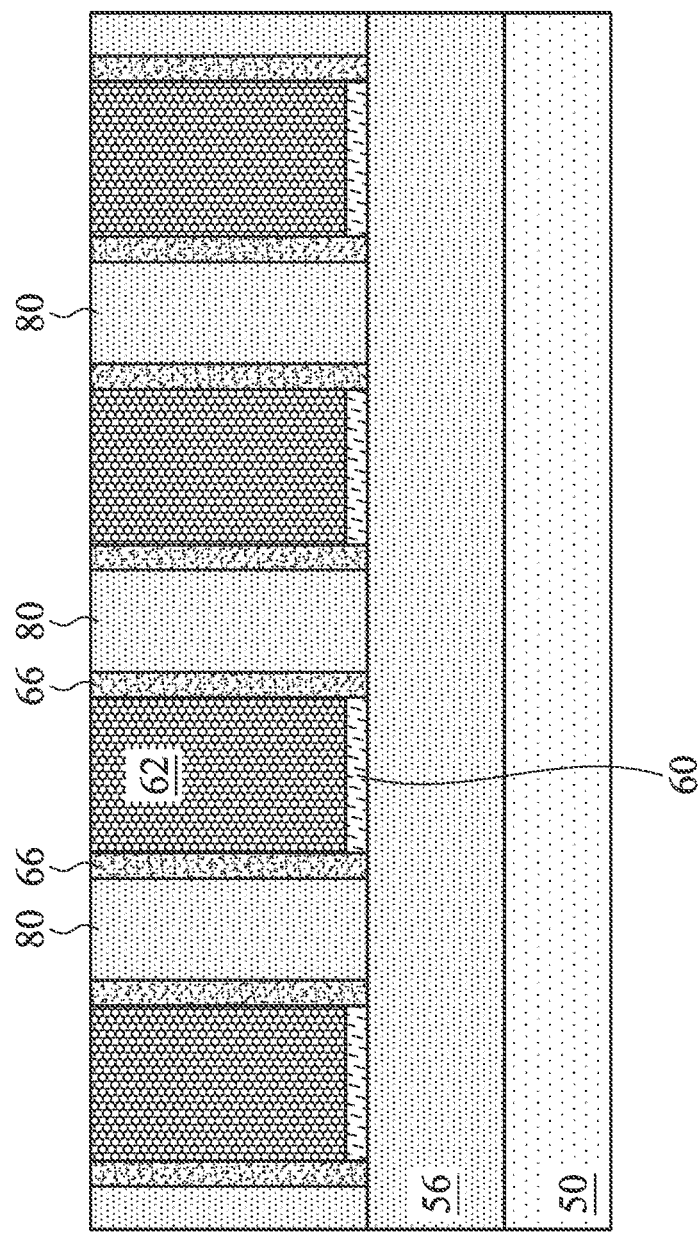
Figure 8C:
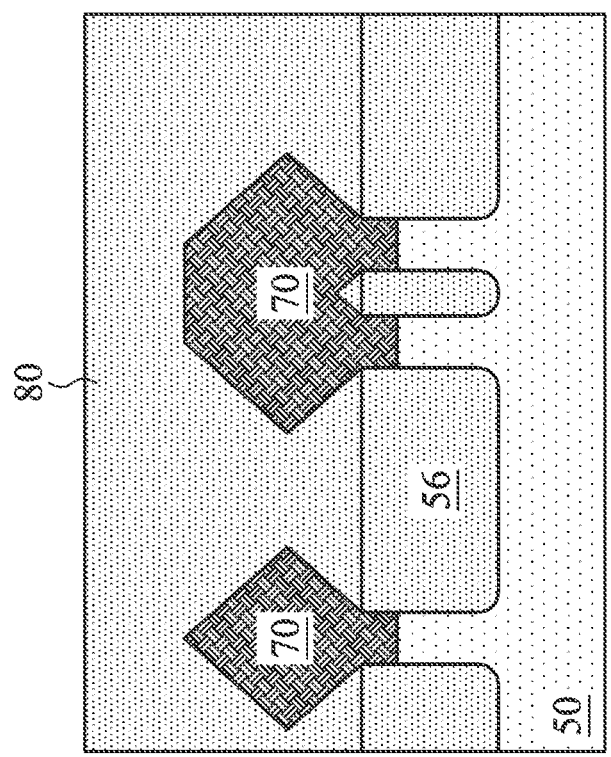
Figure 8D:
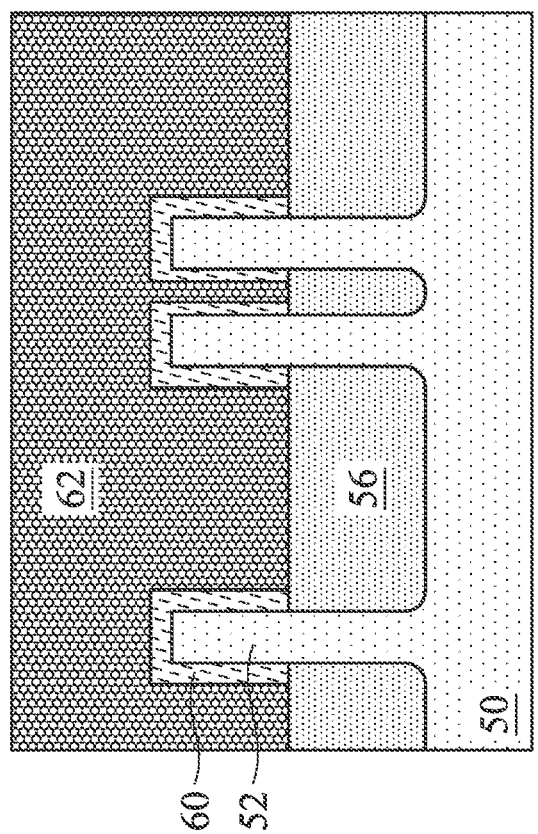
Figure 8E:
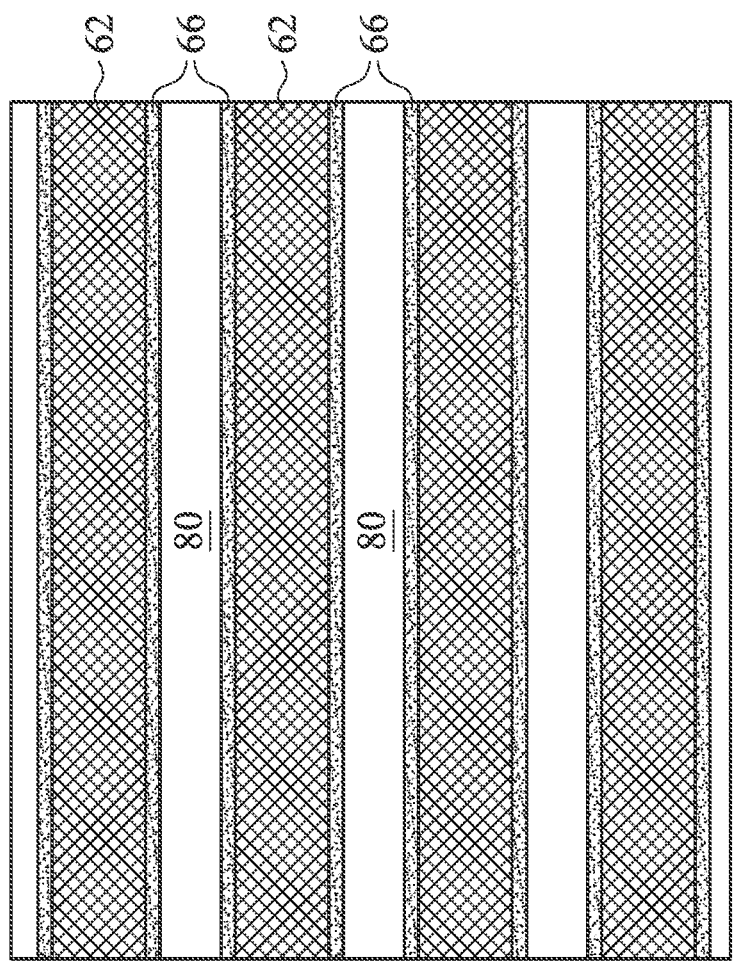
Figure 9A:
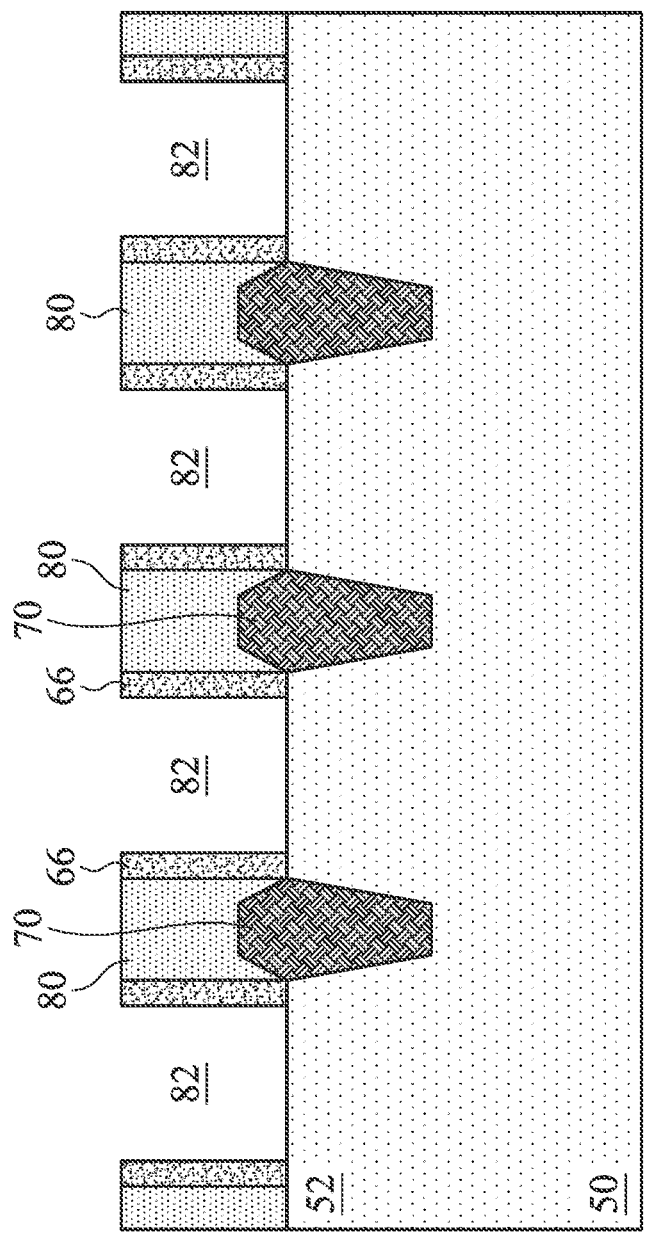
Figure 9B:
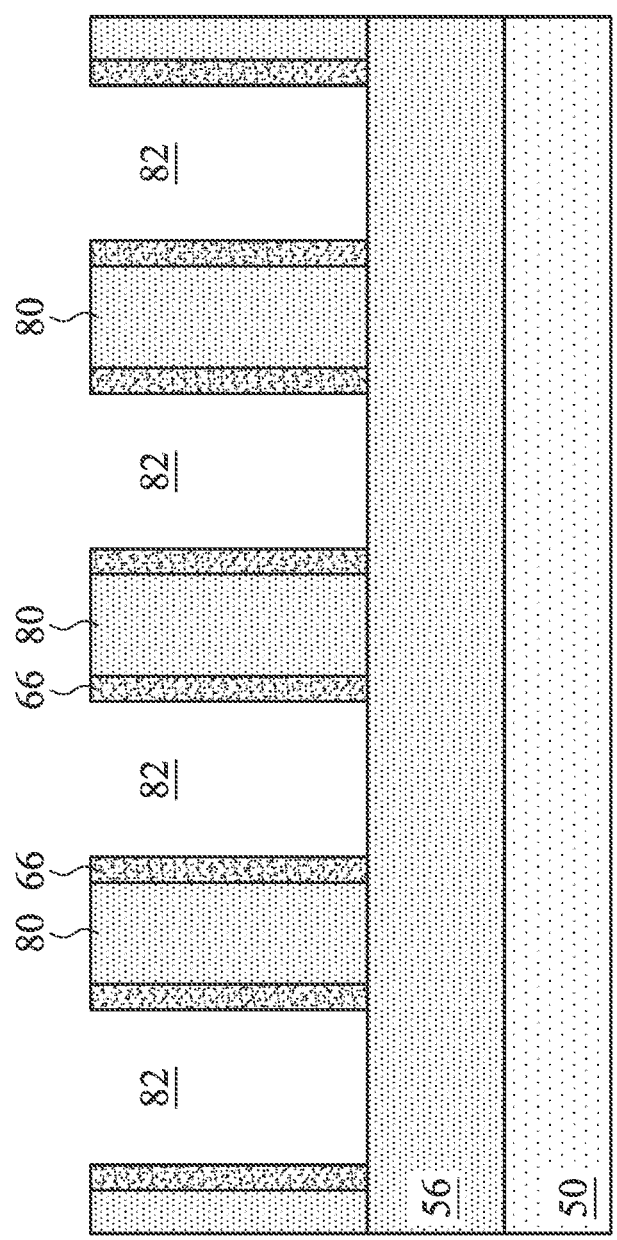
Figure 9C:
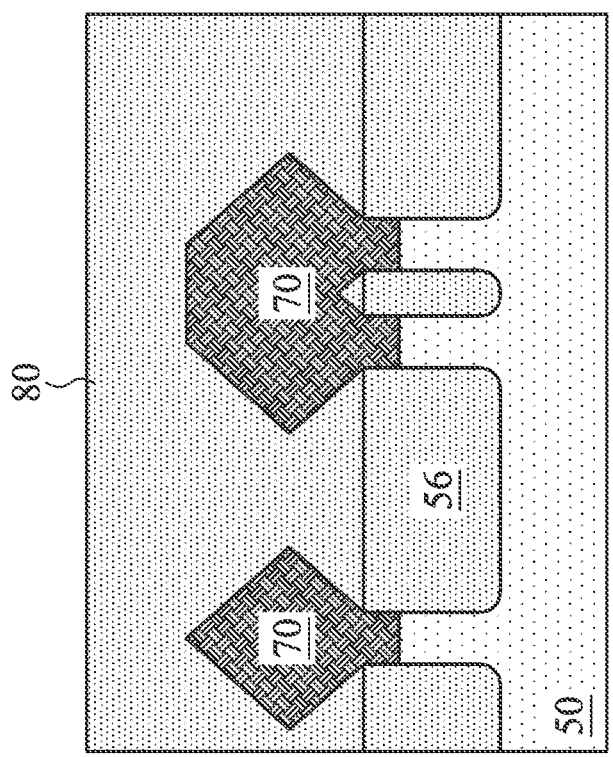
Figure 9D:
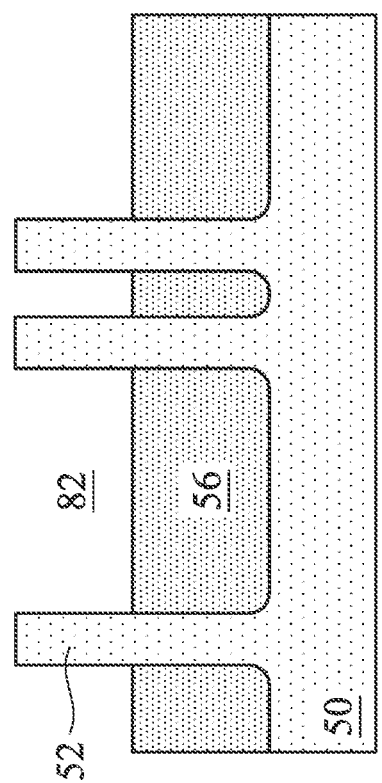
Figure 9E:
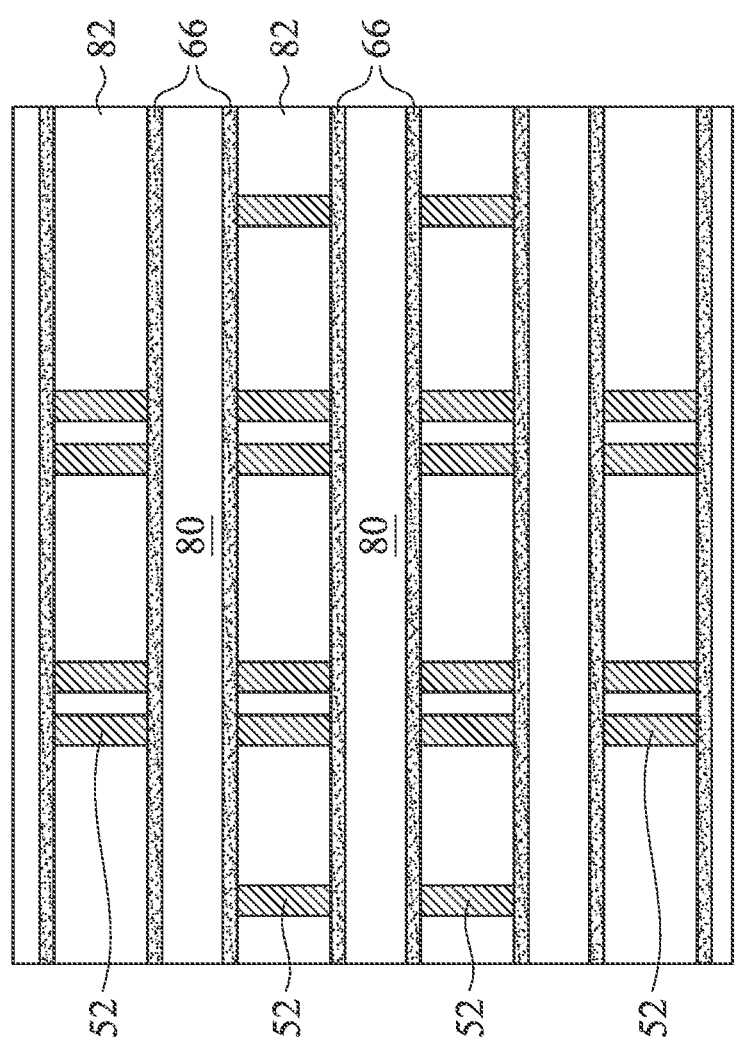
Figure 10A:
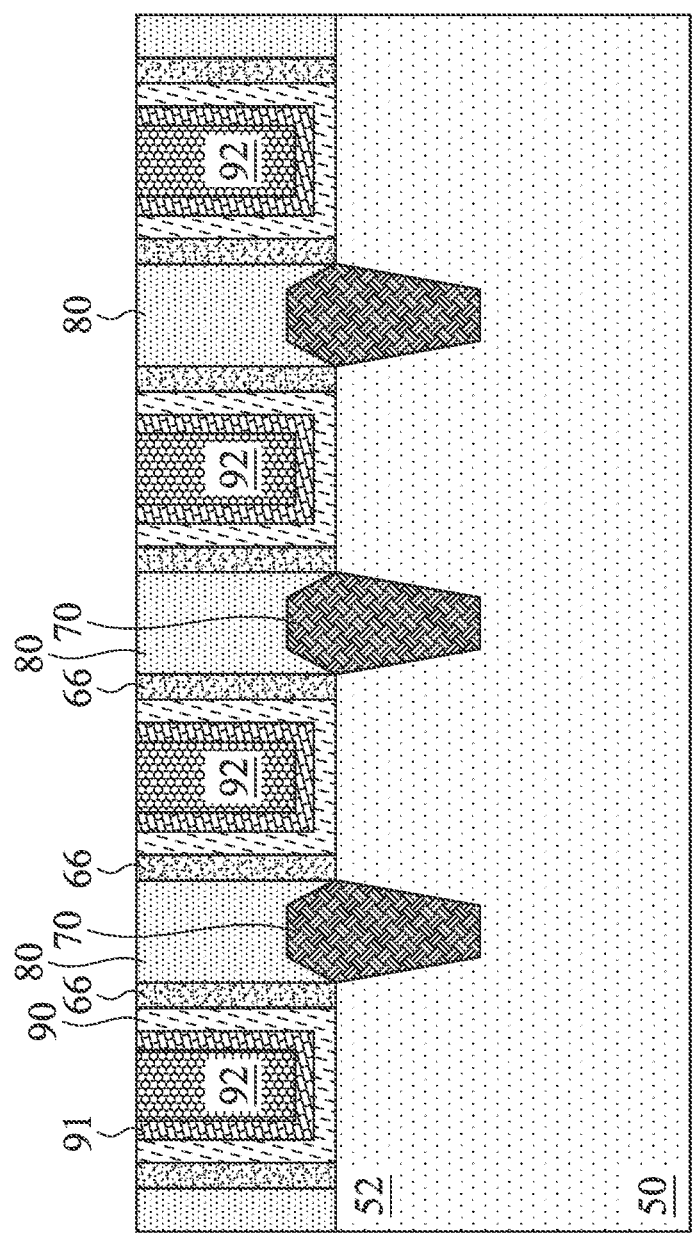
Figure 10B:
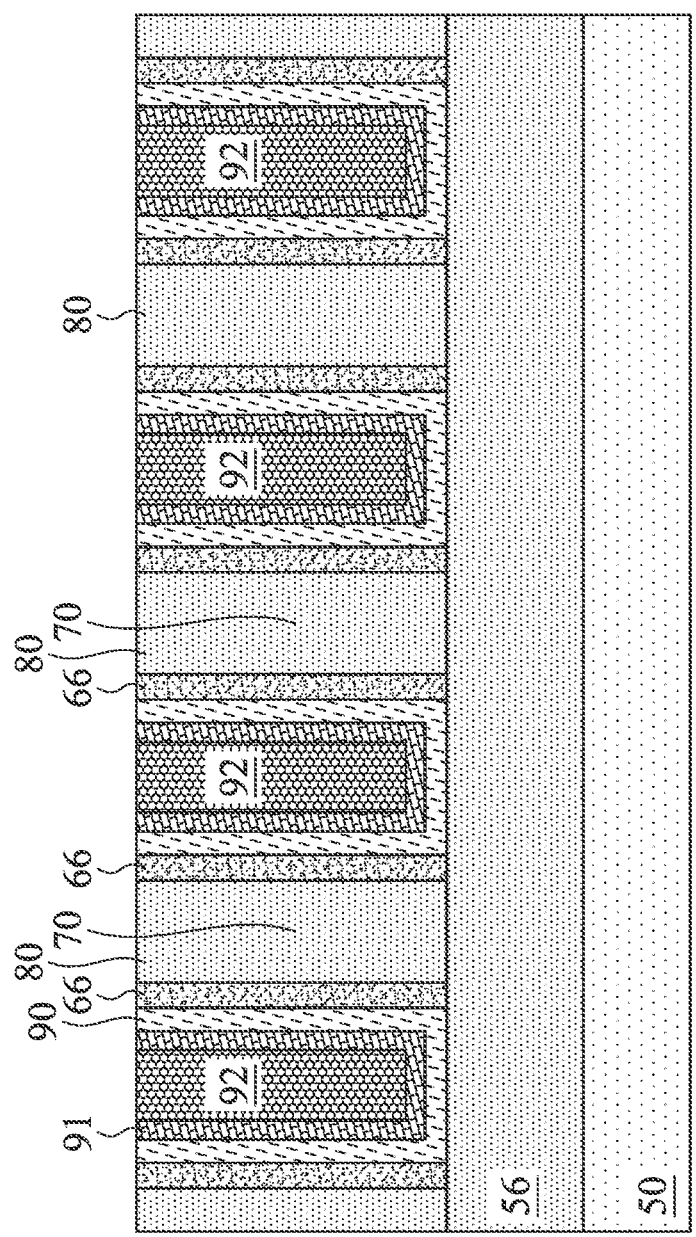
Figure 10D:
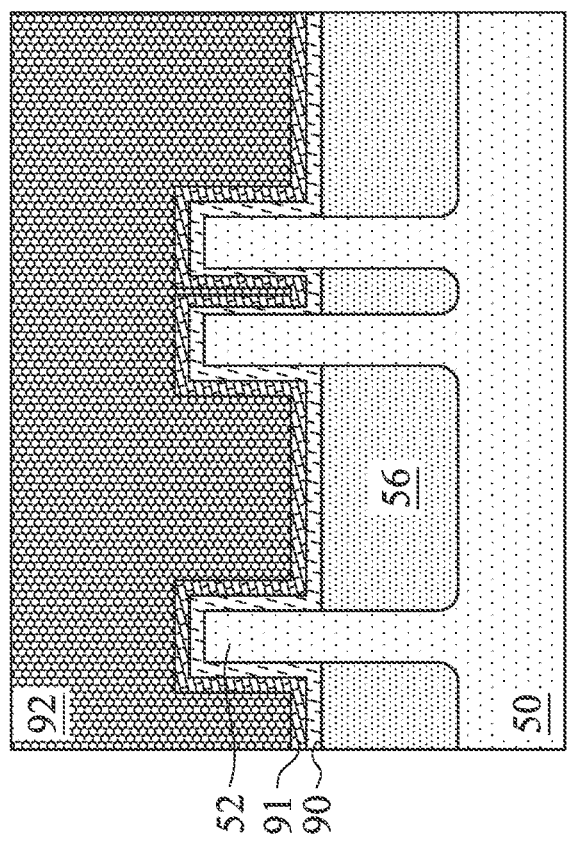
Figure 10C:
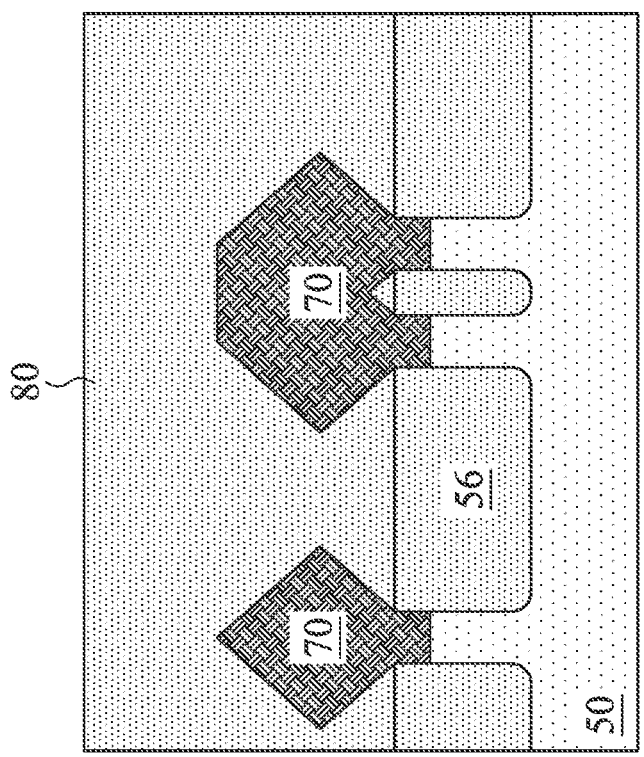
Figure 10E:
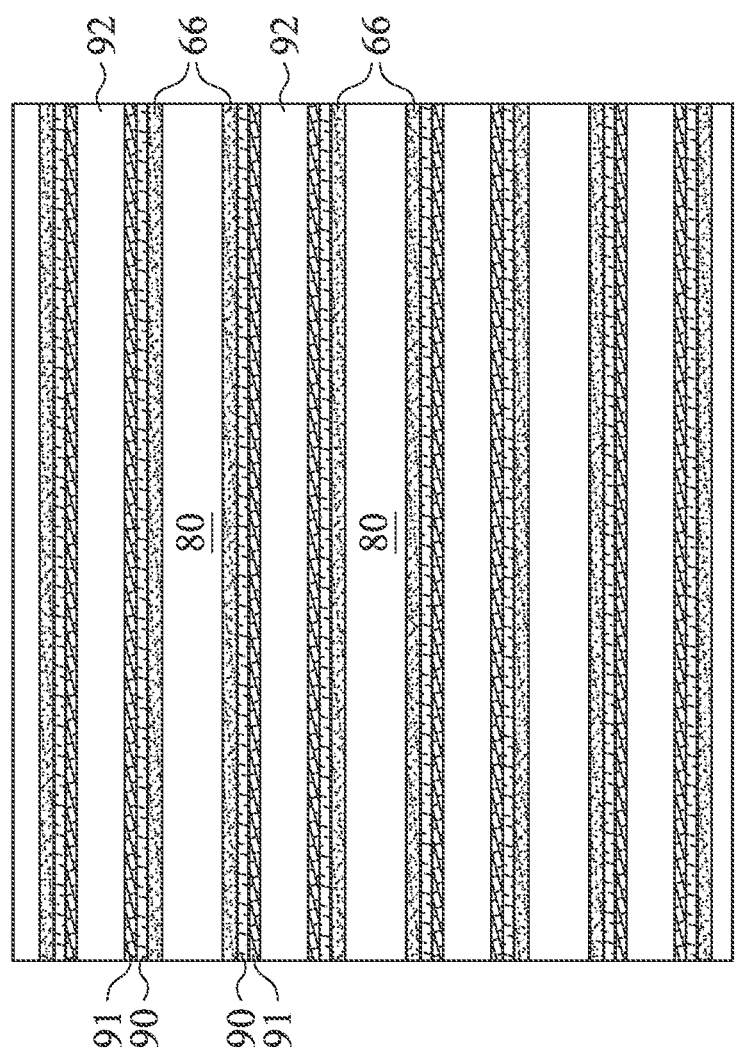

FIGS. 7A, 7B, 7C, 7D, and 7E illustrate the formation of epitaxy source/drain regions 70 in the recesses 68. The epitaxy source/drain regions 70 may include or be silicon germanium (Si$_x$Ge$_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 70 may be formed in the recesses 68 by epitaxially growing a material in the recesses 68, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 7A and 7C, due to blocking by the isolation regions 56, epitaxy source/drain regions 70 are first grown vertically in recesses 68, during which time the epitaxy source/drain regions 70 do not grow horizontally. After the recesses 68 are fully filled, the epitaxy source/drain regions 70 may grow both vertically and horizontally to form facets, which may correspond to crystalline planes of the semiconductor substrate 50. In some examples, different materials are used for epitaxy source/drain regions 70 for p-type devices and n-type devices. Appropriate masking during the recessing or epitaxial growth may permit different materials to be used in different devices.

A person having ordinary skill in the art will also readily understand that the recessing and epitaxial growth of FIGS. 6A-E and 7A-E may be omitted, and that source/drain regions may be formed by implanting dopants into the fins 52. In some examples where epitaxy source/drain regions 70 are implemented, the epitaxy source/drain regions 70 may also be doped, such as by in-situ doping during epitaxial growth and/or by implanting dopants into the epitaxy source/drain regions 70 after epitaxial growth. Example dopants can include or be, for example, boron for a p-type device and phosphorus or arsenic for an n-type device, although other dopants may be used. The epitaxy source/drain regions 70 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

FIGS. 8A, 8B, 8C, 8D, and 8E illustrate the formation of one or more dielectric layers 80. The one or more dielectric layers 80 may include an etch stop layer (ESL) and an interlayer dielectric (ILD), for example. Generally, an etch stop layer can provide a mechanism to stop an etching process when forming, e.g., contacts or vias. An etch stop layer may be formed of a dielectric material having a different etch selectivity from adjacent layers, for example, the interlayer dielectric. The etch stop layer may be conformally deposited over the epitaxy source/drain regions 70, dummy gate stacks, gate spacers 66, and isolation regions 56. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric may be deposited over the etch stop layer. The interlayer dielectric may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The one or more dielectric layers 80 are formed with top surface(s) coplanar with top surfaces of the dummy gates 62. A planarization process, such as a CMP, may be performed to level the top surface of the one or more dielectric layers 80 with the top surfaces of the dummy gates 62. The CMP may also remove the masks 64 (and, in some instances, upper portions of the gate spacers 66) on the dummy gates 62. Accordingly, top surfaces of the dummy gates 62 are exposed through the one or more dielectric layers 80.

FIGS. 9A, 9B, 9C, 9D, and 9E illustrate the removal of the dummy gate stacks. In other examples in which a gate-first process is implemented, the processing of FIGS. 9A-E and 10A-E (described below) may be omitted. The dummy gates 62 and one or more interfacial dielectrics 60 are removed, such as by one or more etching processes, to form recesses 82. The dummy gates 62 may be removed by an etching process selective to the dummy gates 62, wherein the one or more interfacial dielectrics 60 act as etch stop layers, and subsequently, the one or more interfacial dielectrics 60 can be removed by a different etching process selective to the one or more interfacial dielectrics 60. The etching processes can be, for example, a RIE, NBE, a wet etch, or another etching process. Recesses 82 are formed between gate spacers 66 where the dummy gate stacks are removed, and channel regions of the fins 52 are exposed through the recesses 82.

FIGS. 10A, 10B, 10C, 10D, and 10E illustrate the formation of replacement gate structures in the recesses 82 formed by the removal of the dummy gate stacks. The replacement gate structures each include a gate dielectric layer 90, one or more optional conformal layers 91, and a gate electrode 92. The one or more optional conformal layers 91 may include one or more capping layers, barrier layers, and/or work-function tuning layers. The gate dielectric layer 90 can be conformally deposited in the recesses 82 where dummy gate stacks were removed (e.g., on top surfaces of the isolation regions 56, sidewalls and top surfaces of the fins 52 along the channel regions, and sidewalls of the gate spacers 66) and on the top surfaces of the one or more dielectric layers 80 and gate spacers 66. The gate dielectric layer 90 can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer 90 can be deposited by ALD, PECVD, MBD, or another deposition technique.

Then, if implemented, the one or more optional conformal layers 91 may be conformally (and sequentially, if more than one layer) deposited on the gate dielectric layer 90. Example capping layers can include or be titanium nitride, titanium-silicon nitride, titanium-carbon nitride, titanium-aluminum nitride, tantalum nitride, tantalum-silicon nitride, tantalum-carbon nitride, aluminum nitride, the like, or a combination thereof. Example barrier layers can include or be tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, the like, or a combination thereof. Example work-function tuning layers can include or be titanium nitride, titanium aluminum carbide, a titanium aluminum alloy, tantalum-aluminum carbide, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, cobalt, platinum, the like, or a combination thereof. Each of the one or more optional conformal layers 91 may be deposited by ALD, PECVD, MBD, or another deposition technique. Further, different replacement gate structures and/or different sections of a single replacement gate structure can include different work-function tuning layers, which may be for different performance features of the different transistors that are to be formed. A gate cut, such as described below, may be made where a transition occurs between sections of a replacement gate structure with different work-function tuning layers, for example.

A layer for the gate electrodes 92 is formed over the gate dielectric layer 90, and, if implemented, the one or more optional conformal layers 91. The layer for the gate electrodes 92 can fill remaining recesses 82 where the dummy gate stacks were removed. The layer for the gate electrodes 92 may be or comprise a metal-containing material such as W, Co, Ru, Al, Cu. multi-layers thereof, or a combination thereof. The layer for the gate electrodes 92 can be deposited by ALD, PECVD, MBD, PVD, or another deposition technique.

Portions of the layer for the gate electrodes 92, one or more optional conformal layers 91, and gate dielectric layer 90 above the top surfaces of the one or more dielectric layers 80 and gate spacers 66 are removed. For example, a planarization process, like a CMP, may remove the portions of the layer for the gate electrodes 92, one or more optional conformal layers 91, and gate dielectric layer 90 above the top surfaces of the one or more dielectric layers 80 and gate spacers 66. The replacement gate structures comprising the gate electrodes 92, one or more optional conformal layers 91, and gate dielectric layer 90 may therefore be formed as illustrated in FIGS. 10A-E.

FIGS. 11A, 11B, 11C, 11D, and 11E illustrate the formation of cut openings 102 to cut replacement gate structures. In the illustrated example, a mask 100 (e.g., a hard mask) is used to form the cut openings 102. For example, one or more mask layers are deposited over the replacement gate structures, the gate spacers 66, and the one or more dielectric layers 80, and the one or more mask layers are then patterned to form the mask 100 with mask openings corresponding to the cut openings 102. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etching processes, as previously described. The mask 100 can have the mask openings corresponding to cut openings 102 extending in a direction laterally perpendicular to and intersecting the replacement gate structures that are to be cut. Each mask opening can extend laterally perpendicular to and intersect any number of replacement gate structures that will be cut using that mask opening, such as one, two, three, or more replacement gate structures.

Using the mask 100, the replacement gate structures, gate spacers 66, and one or more dielectric layers 80 may be etched such that cut openings 102 are formed cutting the replacement gate structures. The cut openings 102 extend to a depth through the gate electrodes 92 and, if implemented, the one or more optional conformal layers 91. For example, the cut openings 102 can extend to a depth (i) to the corresponding isolation regions 56, (ii) into the corresponding isolation regions 56, and/or (iii) through corresponding isolation regions 56 into the semiconductor substrate 50. In other examples, such as described below with respect to FIGS. 18A-B, the etching process may not completely remove some components within the cut opening 102.

The etching process includes an anisotropic etching process and an isotropic etching process. The anisotropic etch may etch features exposed through the mask openings corresponding to the cut openings 102, such as the one or more dielectric layers 80, gate electrodes 92 and any conductive layer of the one or more optional conformal layers 91, to a predefined depth. During the isotropic etching process, the isotropic etching process may etch, e.g., including laterally etching, conductive features exposed through the mask openings corresponding to the cut openings 102, such as the gate electrodes 92 and any conductive layer of the one or more optional conformal layers 91, at a rate greater than non-conductive features are etched. For example, the isotropic etching process may etch the gate electrodes 92 at a rate that is about 1.5 or more times the rate that the one or more dielectric layers 80 (e.g., the ILD) is etched.

In an example, the etching process includes an anisotropic etching process followed by an isotropic etching process, which may further include one or more cleaning processes. The anisotropic etching process can include one or more cycles that each includes a passivation deposition, a passivation break through, a gate etching, and a flash etching.

The passivation deposition can include passivating sidewalls 103 of mask openings of the mask 100 and any sidewalls of the cut opening 102 that exist at the time of the passivation deposition. The passivation deposition can include exposing the structure to a plasma that includes a gas mixture of silicon tetrachloride ($SiCl_4$), hydrogen bromide (HBr), and helium (He). Other gases may be included in the gas mixture. By exposing the structure to the plasma, a passivation liner (e.g., comprising a polymer) can be deposited on surfaces (e.g., sidewalls) of mask openings and cut openings 102 by byproducts being sputtered to those surfaces as a result of the exposure.

The passivation break through can include removing the passivation liner on bottom surfaces of the cut openings 102. The passivation break through can include exposing the passivation liner to a plasma that includes a gas mixture of carbon tetrafluoride ($CF_4$) and helium (He). Other gases may be included in the gas mixture.

After the passivation break through, the gate etching can include etching portions of the gate electrodes 92 and one or more optional conformal layers 91 that are exposed through the passivation liner. The gate etching can include exposing the structure to plasma that includes a gas mixture of silicon tetrachloride ($SiCl_4$), boron trichloride ($BCl_3$), chlorine ($Cl_2$), and helium (He). Other gases may be included in the gas mixture.

After the gate etching, the flash etching can include removing the passivation liner. The flash etching can include exposing the structure to plasma that includes a gas mixture of methane ($CH_4$) and oxygen ($O_2$). Other gases may be included in the gas mixture.

The isotropic etching process may be implemented by an ICP etch or other process. The isotropic etching process can use a gas mixture including silicon tetrachloride ($SiCl_4$) and chlorine ($Cl_2$). In other examples, other isotropic etching processes and/or other etchants may be used.

A cleaning process may be implemented subsequent to the isotropic etching process. For example, an Electron Cyclotron Resonance (ECR) plasma process using a gas including chlorine ($Cl_2$) and bromine trichloride ($BCl_3$) may be implemented, which may remove metal residue from the etching process.

Figure 11A:
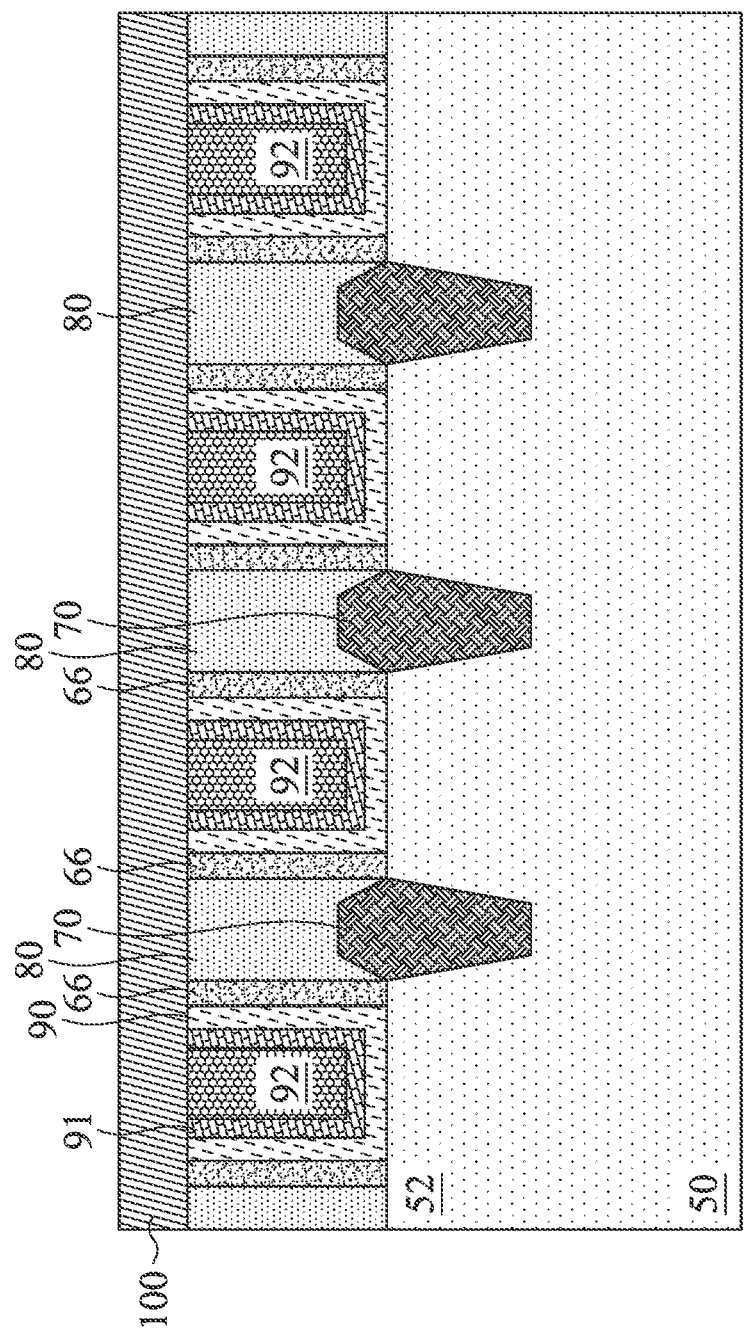
Figure 11B:
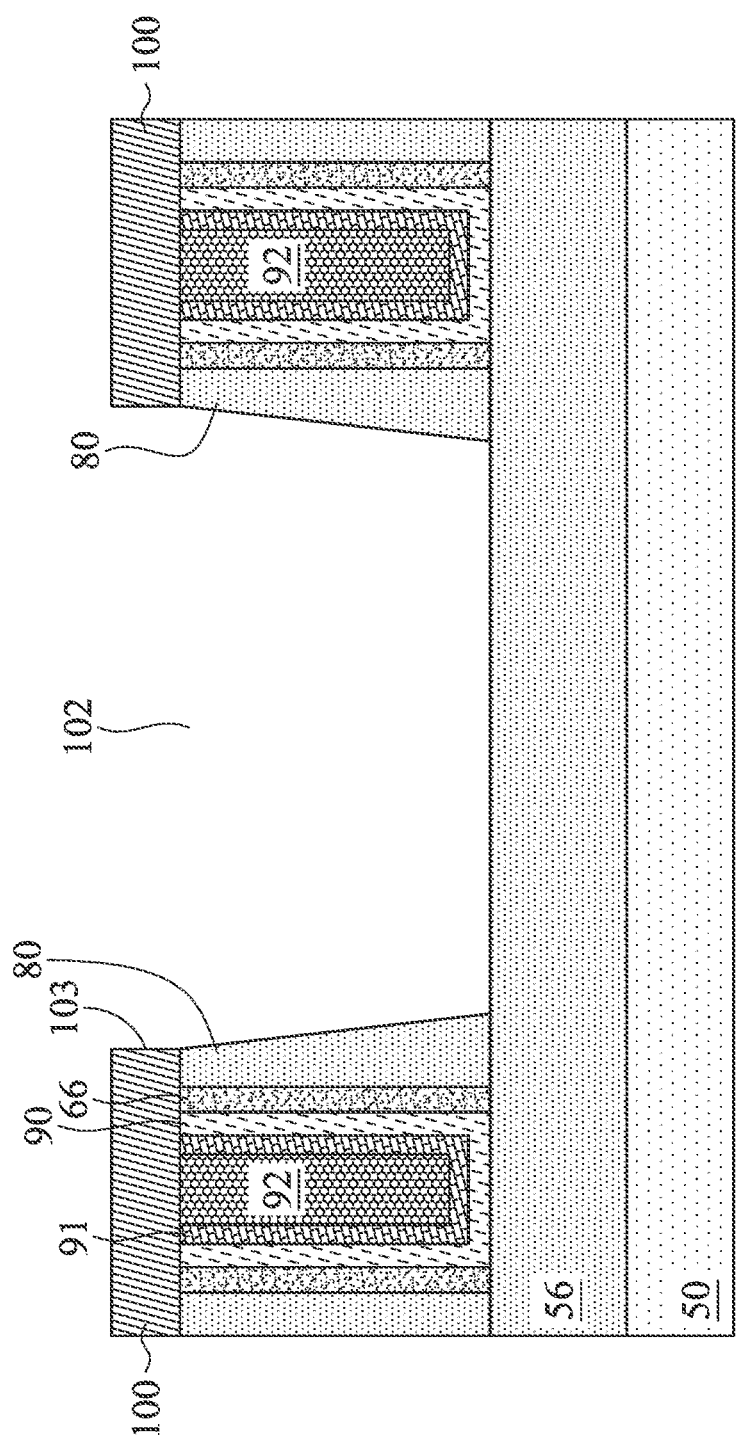
Figure 11D:
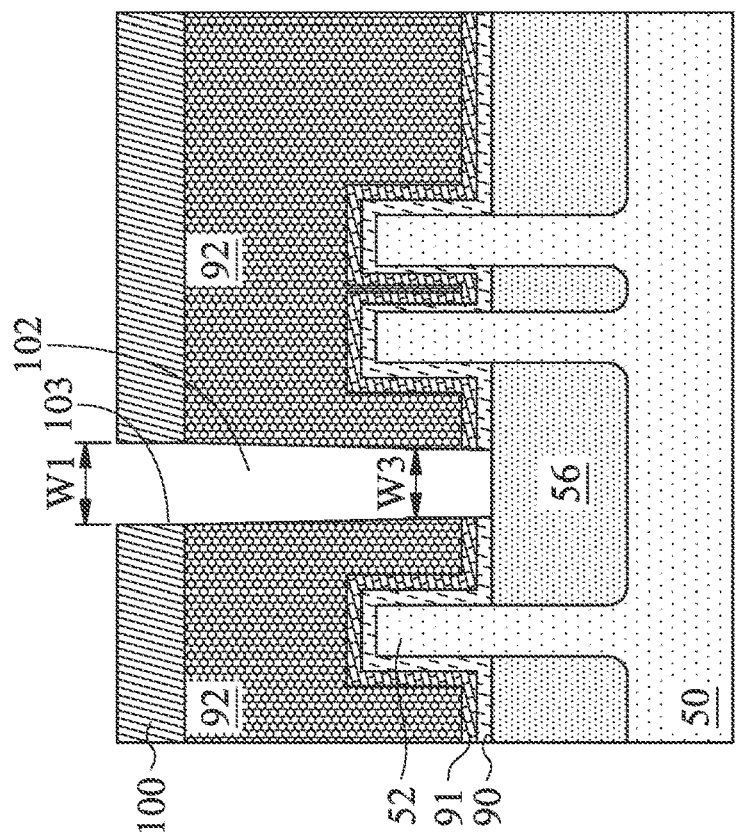
Figure 11C:
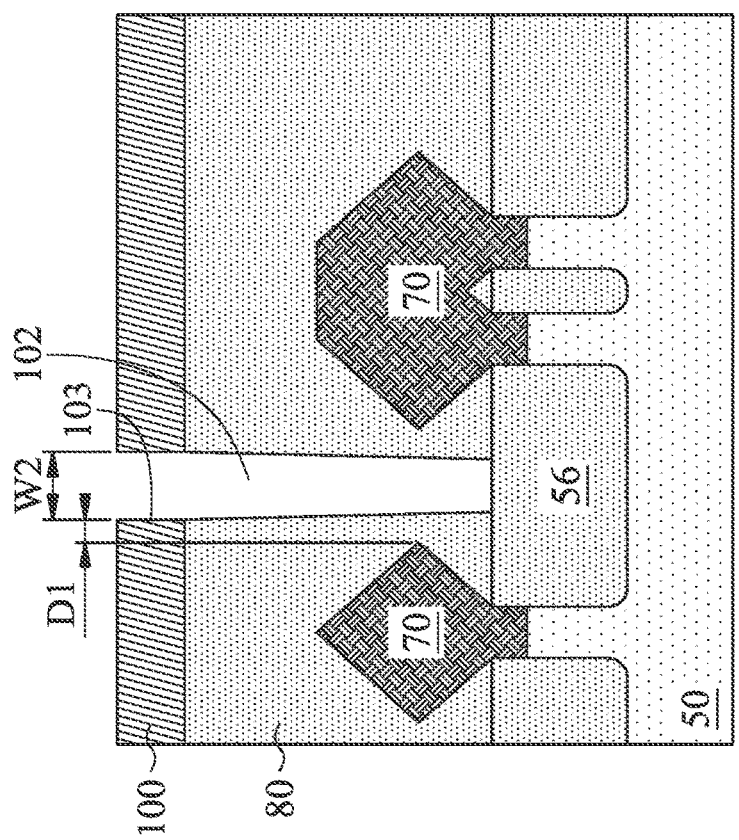
Figure 11E:
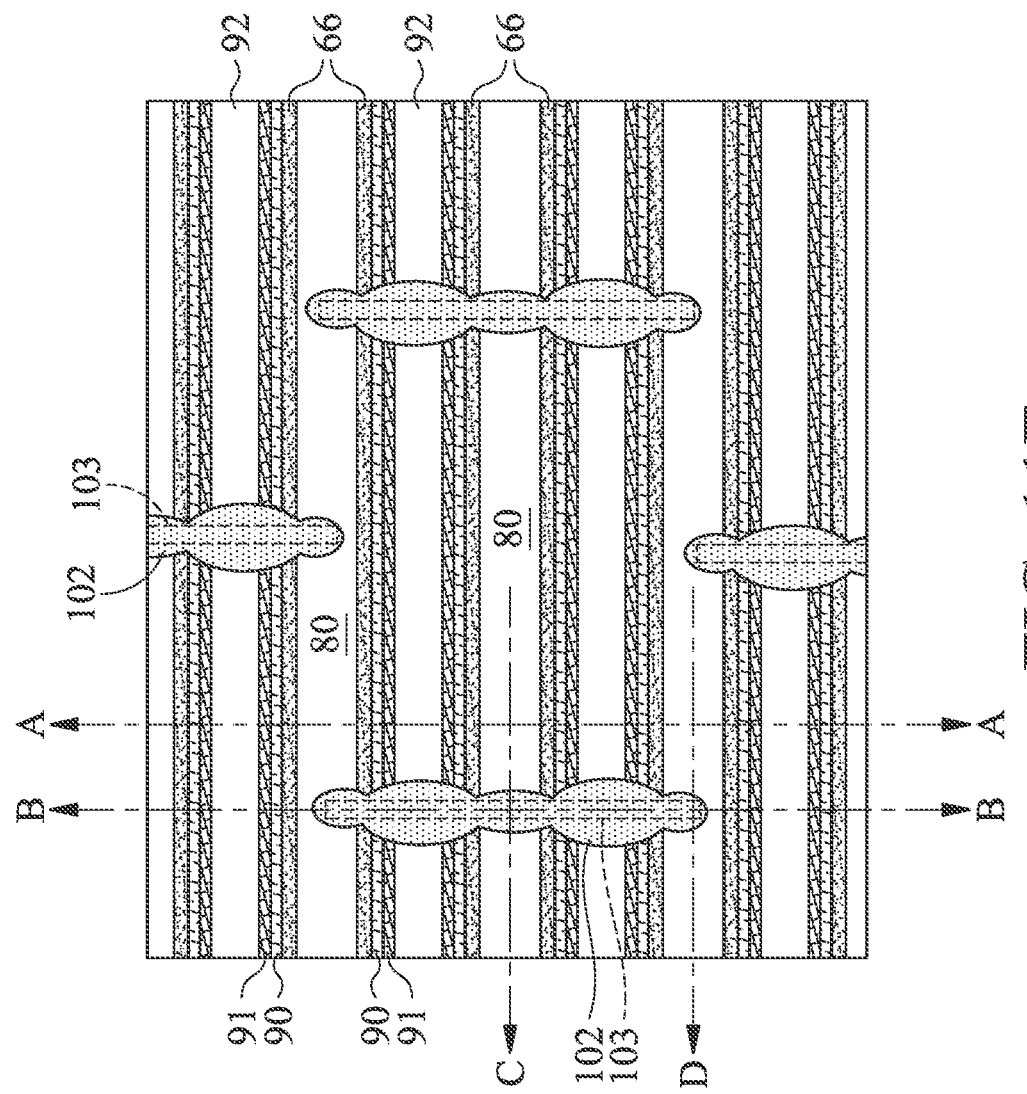
Figure 12A:
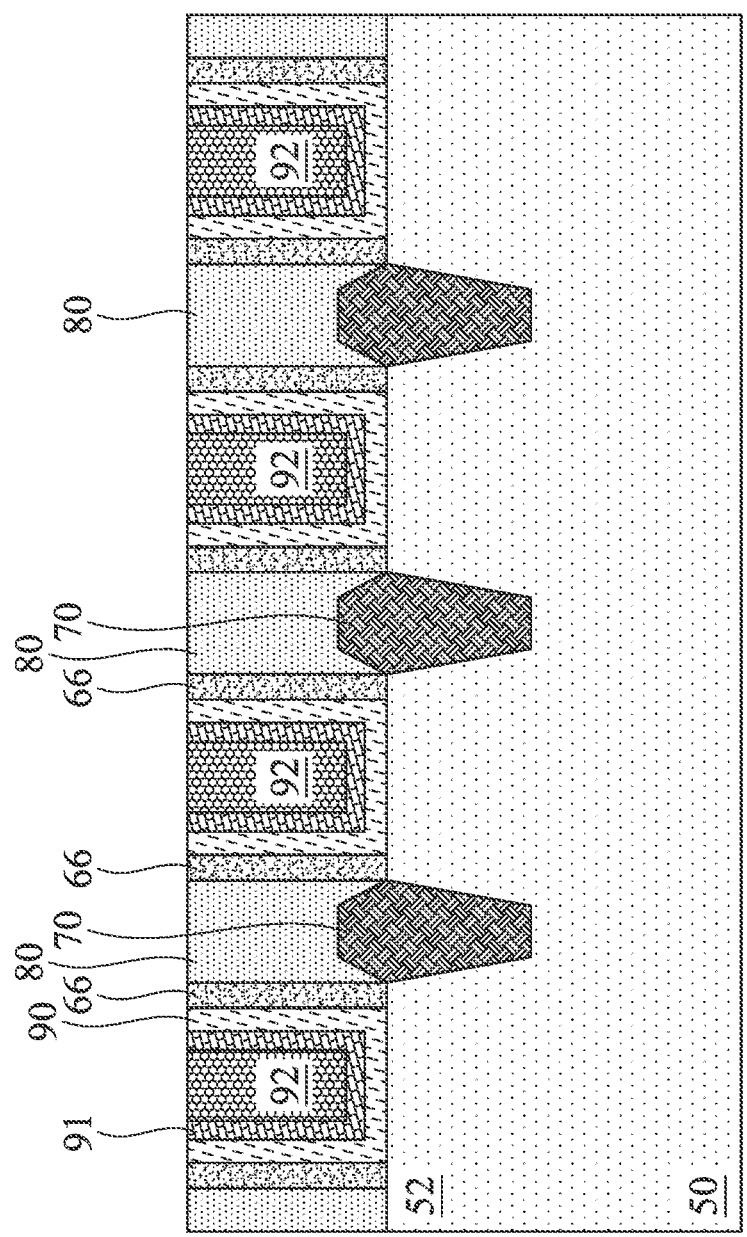
Figure 12B:
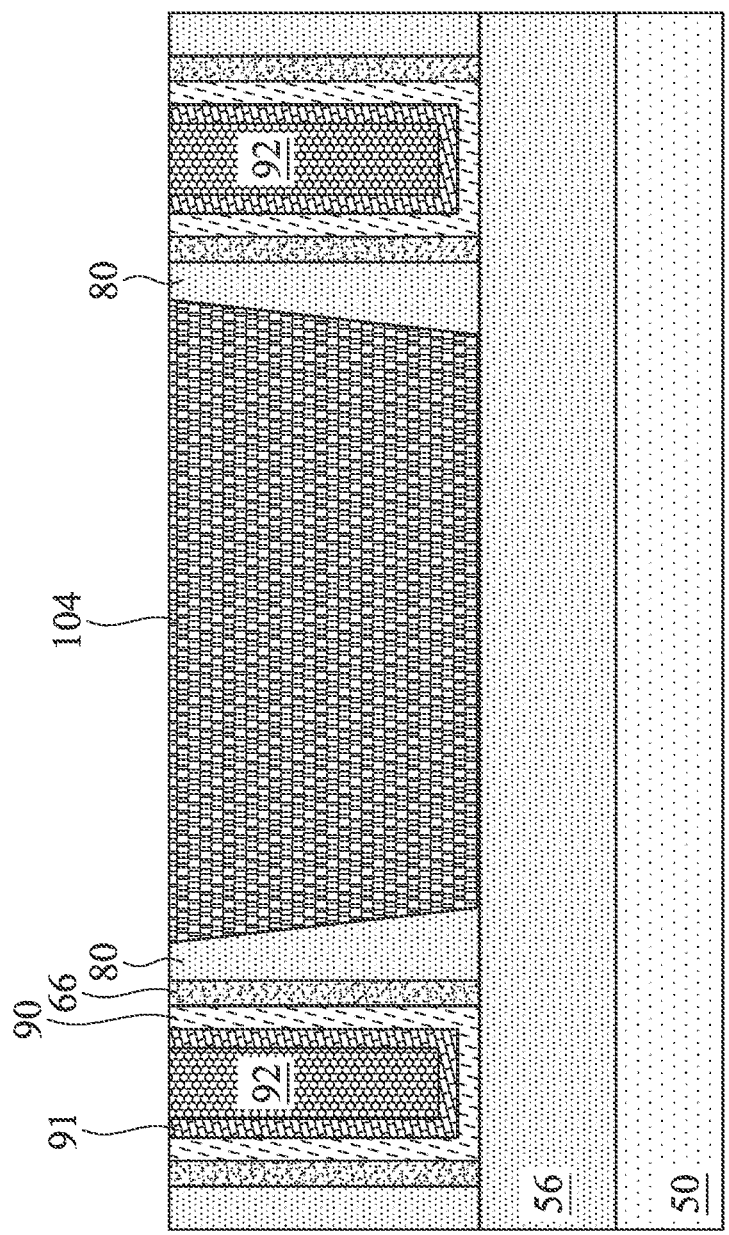
Figure 12D:
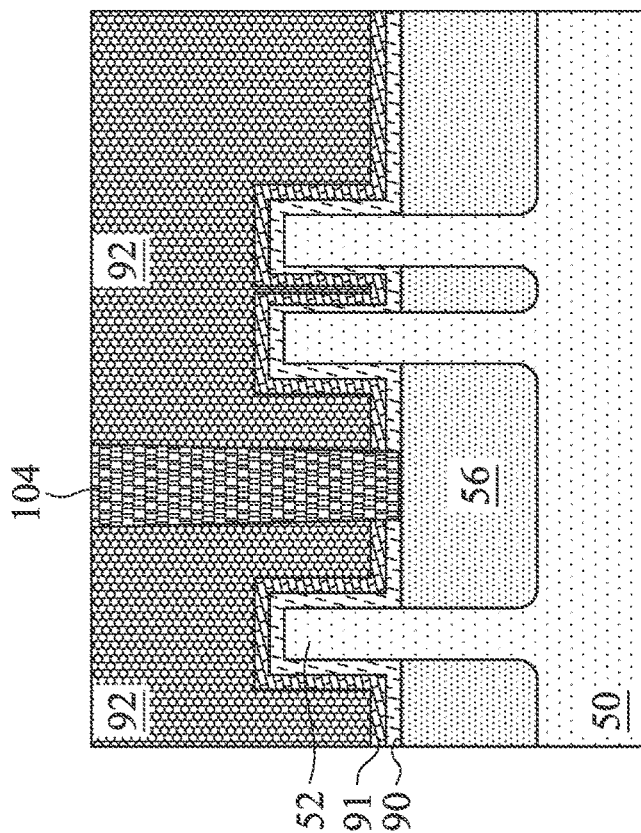
Figure 12C:
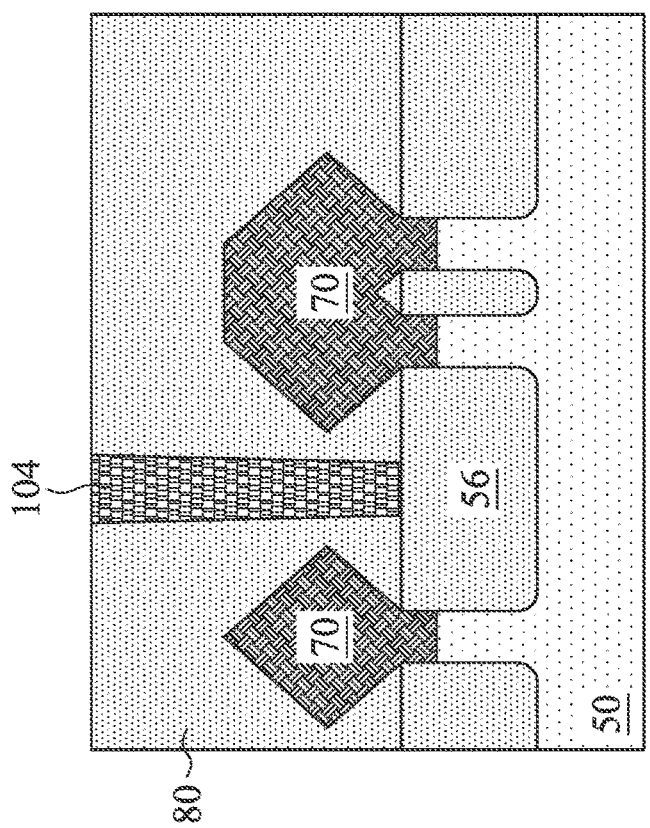
Figure 12E:
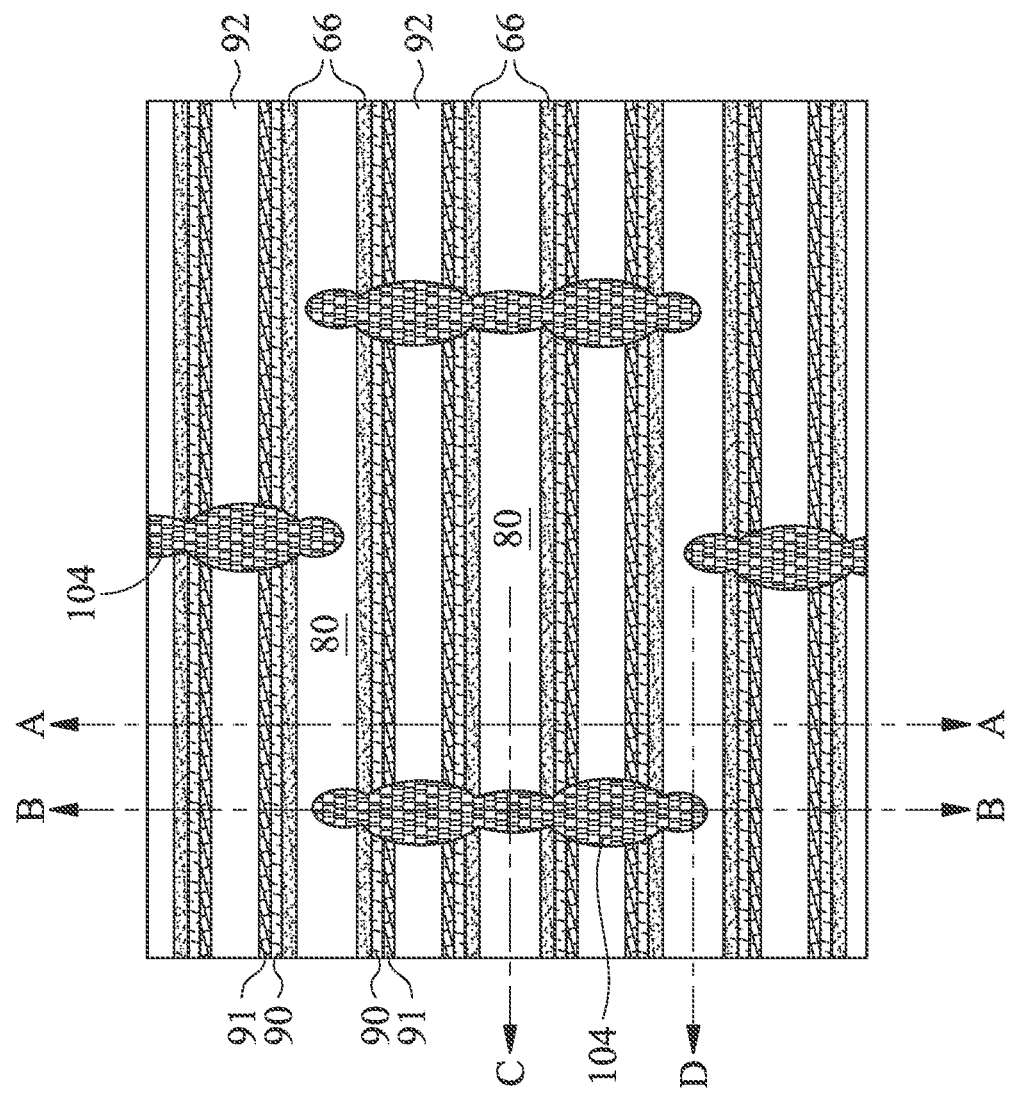
Figure 13A:
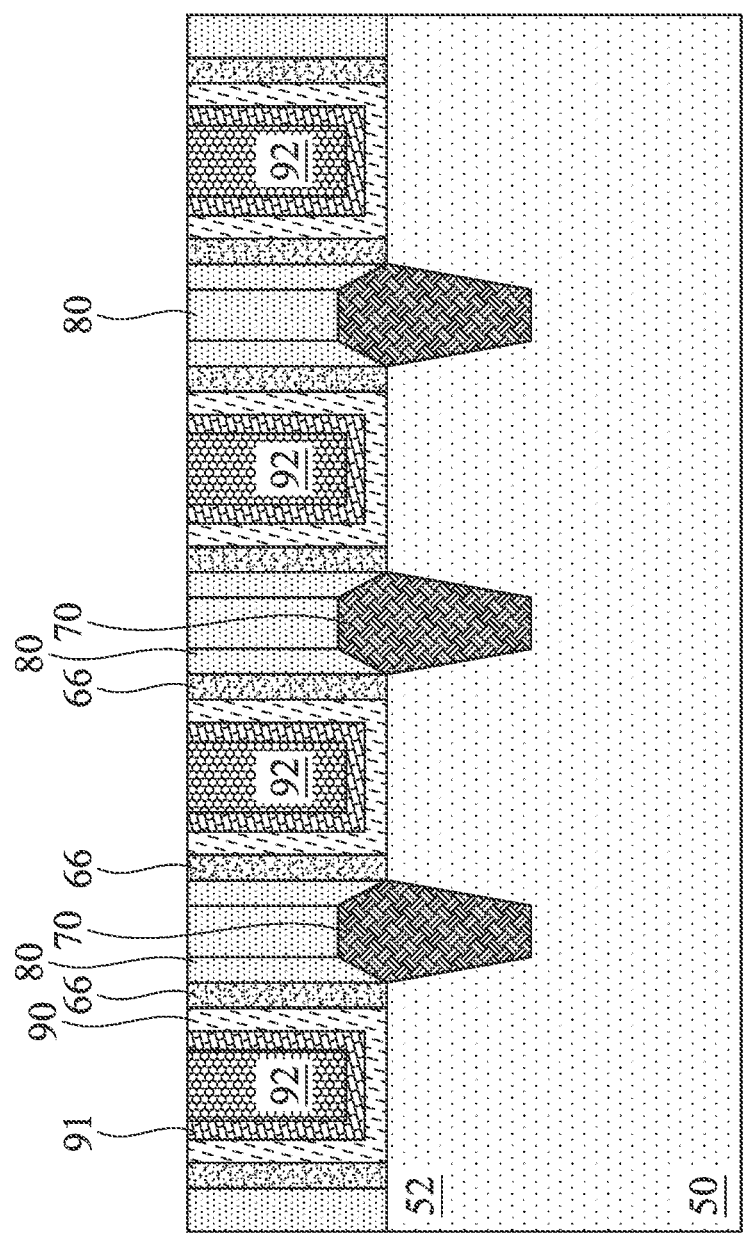
Figure 13B:
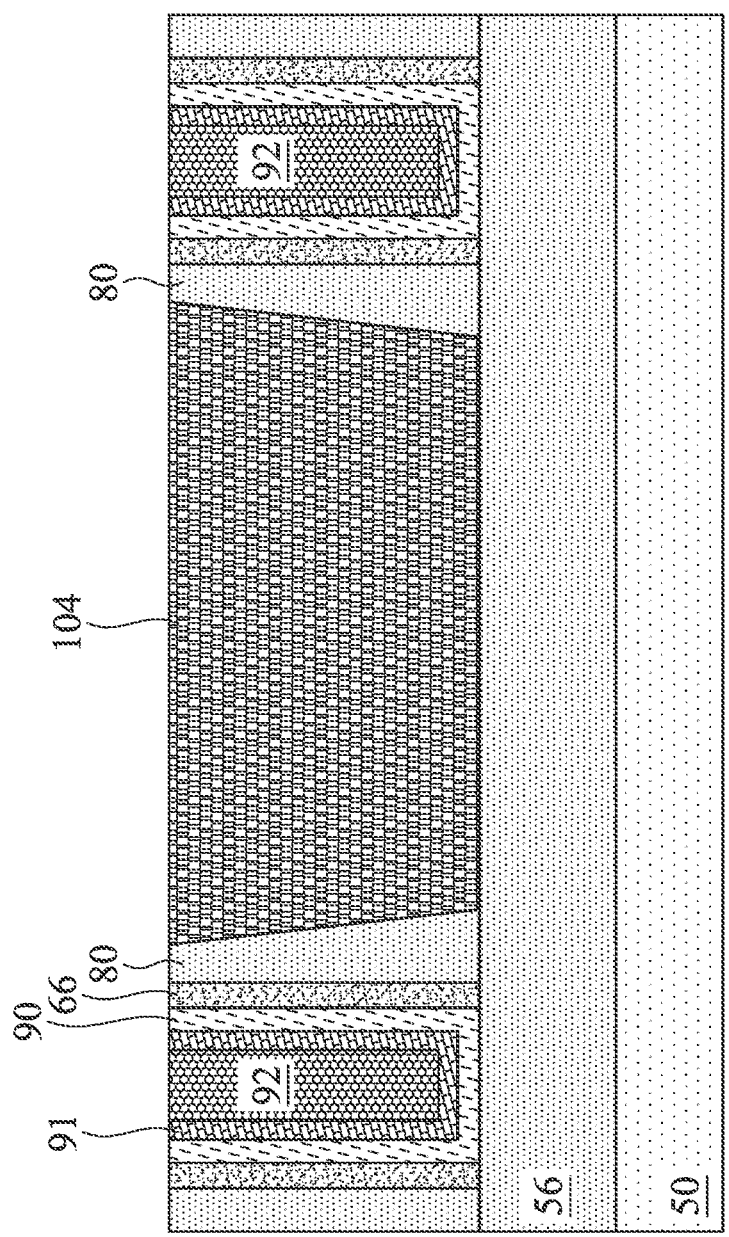
Figure 13D:
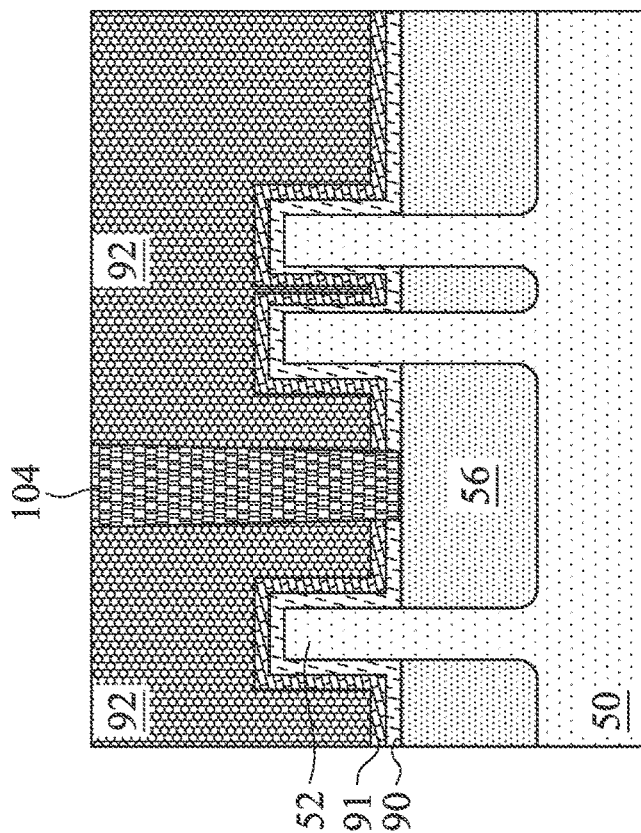
Figure 13C:
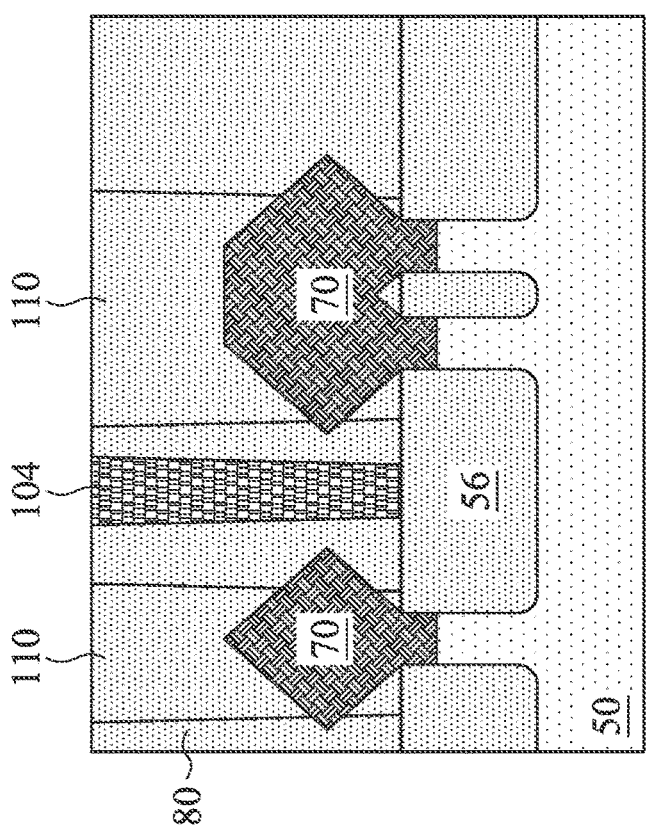
Figure 13E:
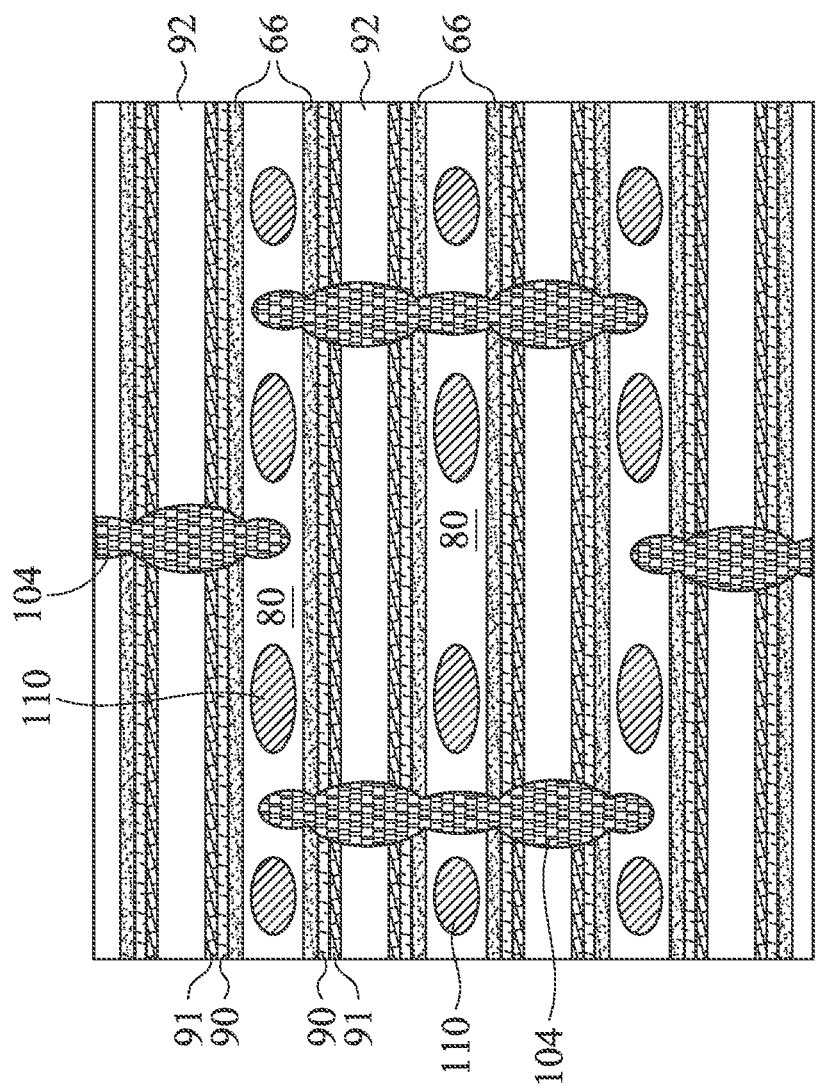
Figure 14A:
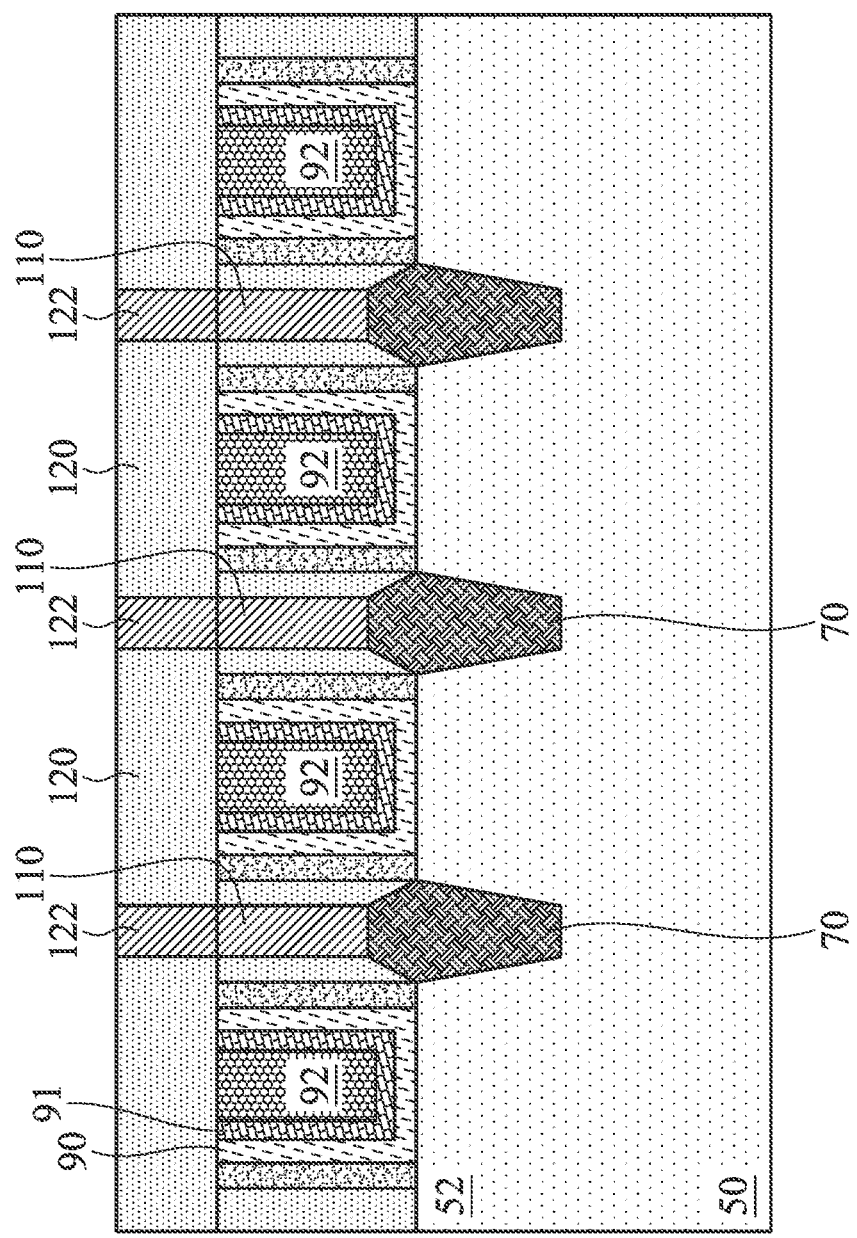
Figure 14B:
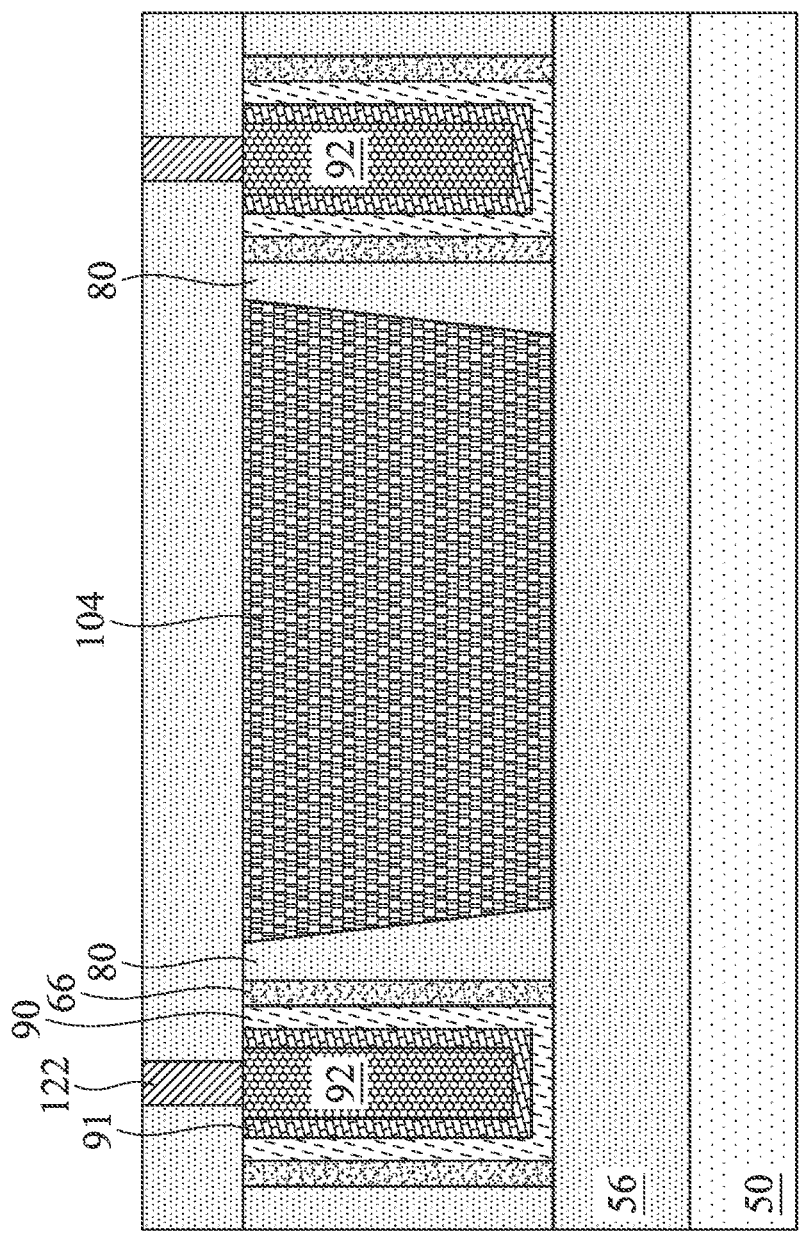
Figure 14D:
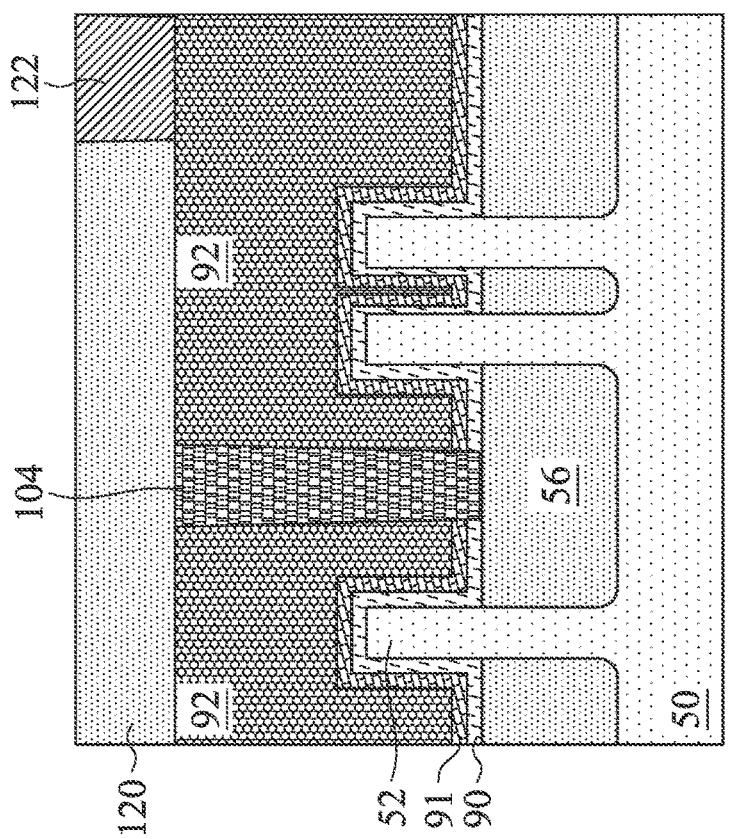
Figure 14C:
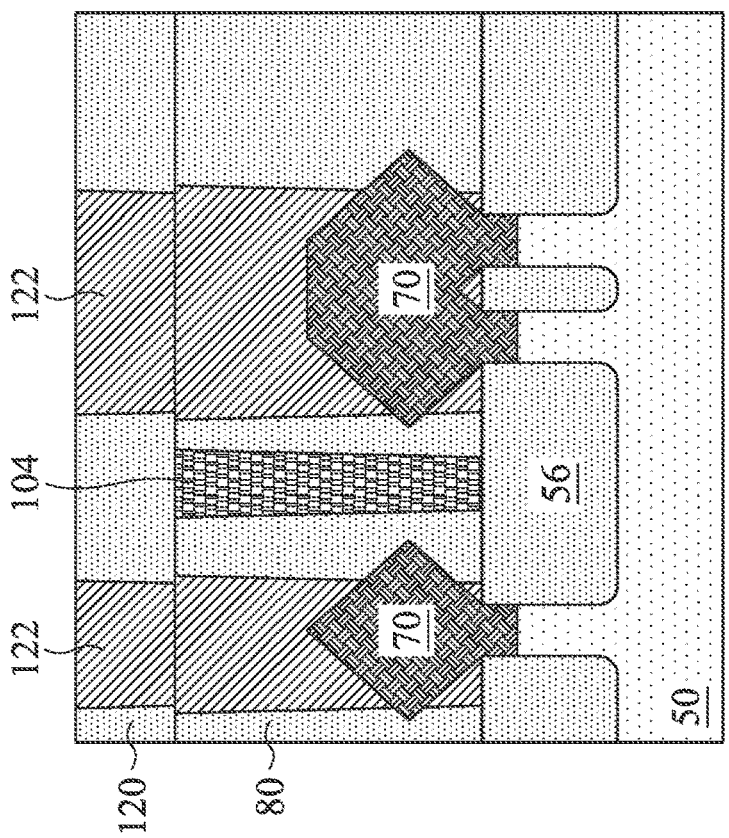
Figure 14E:
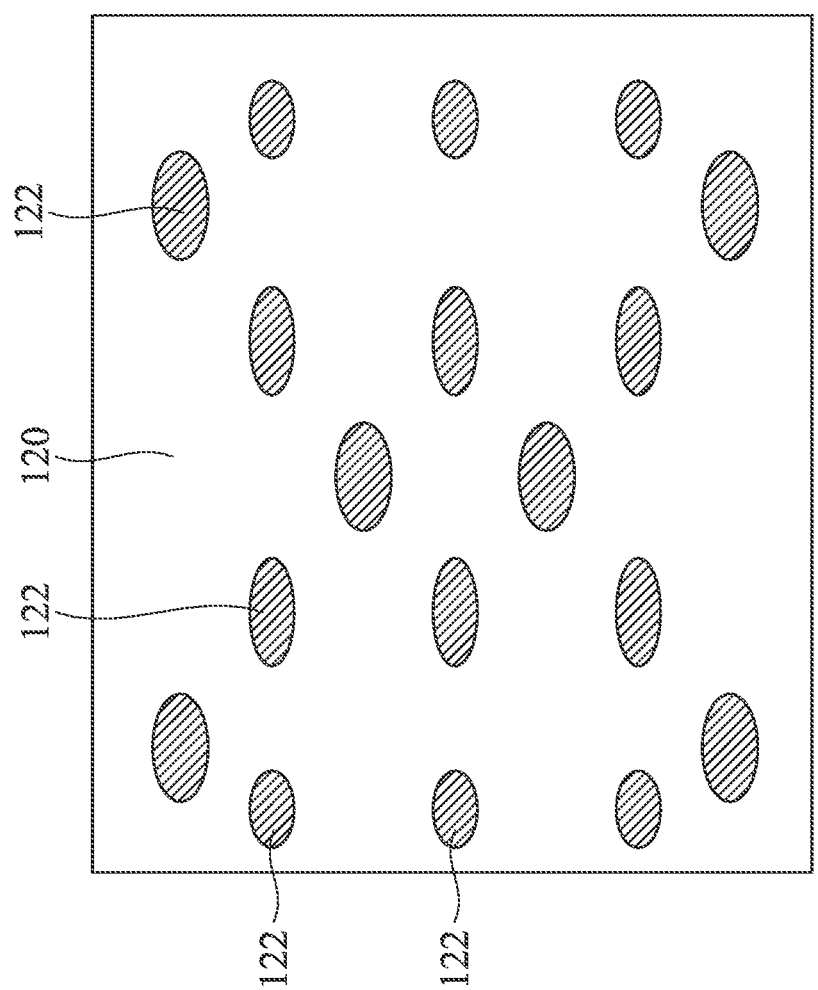
Figure 15:
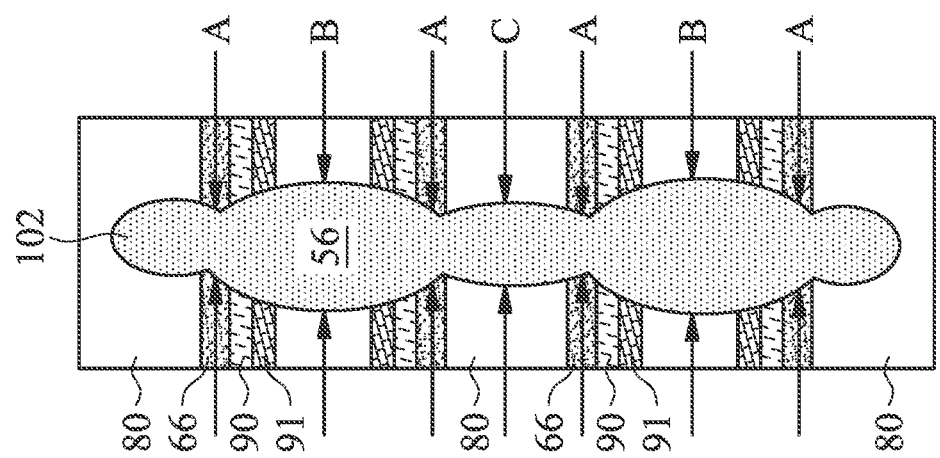
FIG. 15 is a top view of an example cut opening in accordance with some embodiments.

FIG. 11E shows the layout profiles of the cut openings 102 formed in the etching process. FIG. 11E does not explicitly depict the mask 100, but illustrates sidewalls 103 (in dashed lines) of mask openings of the mask 100. Generally, as FIG. 11E illustrates, each cut opening 102 has primary portions each between (e.g., along cross-section D) sections of a replacement gate structure that is cut by the cut opening 102, and has an intermediate portion extending between (e.g., along cross-section B-B) neighboring primary portions. Additionally, each cut opening 102 may have distal portions extending beyond the replacement gate structures that are cut by the cut opening 102. Each primary portion extends vertically through the gate electrode 92 and the one or more optional conformal layers 91 of the respective replacement gate structure. The primary portion has a width W1 at the top surface of the gate electrode 92 that is cut. Each primary portion electrically separates the sections of the gate electrode 92 that is cut by that primary portion. The intermediate portion extends vertically through the one or more dielectric layers 80, and extends laterally between the neighboring replacement gate structures that are cut (e.g., along cross-section B-B) and between epitaxy source/drain regions 70 (e.g., along cross-section C). The intermediate portion has a width W2 at the top surface of the one or more dielectric layers 80. The width W1 of the primary portions is greater than the width W2 of the intermediate portions. FIG. 15 illustrates in more detail an example cut opening 102.

As previously described, the etching process that forms the cut openings 102 includes an isotropic etching process that has different etch rates for different materials being etched. Since the etch rate of the gate electrode 92 is greater than the etch rate of, e.g., the one or more dielectric layers 80 (e.g., the ILD), during the isotropic etching process, the cut opening 102 has more of the gate electrode 92 etched to form the greater width W1 than the one or more dielectric layers 80 to form the width W2. The etching process and the resulting cut openings 102 can therefore permit a greater amount of the gate electrode 92 and any conductive layer of the one or more optional conformal layers 91 to be removed while a lesser amount of the one or more dielectric layers 80 between neighboring epitaxy source/drain regions 70 is removed. This can increase a distance D1 between an epitaxy source/drain region 70 and a cut opening 102, which can in turn reduce a risk of damage to the epitaxy source/drain region 70 since the one or more dielectric layers 80 remains between the epitaxy source/drain region 70 and the cut opening 102. In some examples, the distance D1 is in a range from about 5 nm to about 15 nm.

In the cross-section shown in FIG. 11D, the cut opening 102 may have vertical or inclined sidewalls. For example, the cut opening 102 may have vertical sidewalls where the width W1 at the top surface of the gate electrode 92 is equal to the width W3 at the bottom of the gate electrode 92. In other examples, the cut opening 102 may have inclined sidewalls where the width W1 at the top surface of the gate electrode 92 is greater than or less than the width W3 at the bottom of the gate electrode 92. Similar sidewalls may be formed at other portions of the cut opening 102.

FIGS. 12A, 12B, 12C, 12D, and 12E illustrate the formation of gate cut-fill structures 104 in the cut openings 102. An insulating material for the gate cut-fill structures 104 is deposited in the cut openings 102 that cut the replacement gate structures. In some examples, each of the gate cut-fill structures 104 may be a single insulating material, and in other examples, the gate cut-fill structures 104 may include multiple different insulating materials, such as in a multi-layered configuration. In some examples, the insulating material may include or be silicon oxide, silicon nitride, silicon oxynitride, silicon carbide, silicon carbon nitride, the like, or a combination thereof, and may be deposited by CVD, PVD, ALD, or another deposition technique. The mask 100 and portions of the insulating material for the gate cut-fill structures 104 above the mask 100 are removed. For example, a planarization process, like a CMP, may remove the portions of the insulating material for the gate cut-fill structures 104 above the mask 100 and may remove the mask 100, and top surfaces of the gate cut-fill structures 104 may be formed coplanar with the top surface of the one or more dielectric layers 80. The CMP may further remove upper portions of the replacement gate structures, the gate spacers 66, and one or more dielectric layers 80. For example, the CMP may remove the replacement gate structures such that each replacement gate structure has a height of 20 nm above a top surface of the respective fin 52.

The gate cut-fill structures 104 therefore electrically isolate sections of the replacement gate structures that were cut from each other. Further, in some examples, the gate cut-fill structures 104 may act as stressors for the channels of the fins 52, such as when the gate cut-fill structures 104 include or are silicon nitride. This can increase the channel mobility of the FinFETs that are to be formed.

FIGS. 13A, 13B, 13C, 13D, and 13E illustrate the formation of conductive features 110, such as including contacts, through the one or more dielectric layers 80 to epitaxy source/drain regions 70 of the fins 52. For example, openings may be formed through the one or more dielectric layers 80 to the epitaxy source/drain regions 70 to expose at least respective portions of the epitaxy source/drain regions 70. The openings may be formed using, for example, appropriate photolithography and etching processes. An adhesion layer can be conformally deposited in the openings, such as on the epitaxy source/drain regions 70, and a barrier layer can be conformally deposited on the adhesion layer, for example. The adhesion layer may be or comprise, for example, titanium, cobalt, nickel, the like or a combination thereof, and may be deposited by ALD, CVD, or another deposition technique. The barrier layer may be or comprise titanium nitride, titanium oxide, tantalum nitride, tantalum oxide, the like, or a combination thereof, and may be deposited by ALD, CVD, or another deposition technique. Silicide regions may be formed on upper portions of the epitaxy source/drain regions 70 by reacting upper portions of the epitaxy source/drain regions 70 with the adhesion layer and/or barrier layer. An anneal can be performed to facilitate the reaction of the epitaxy source/drain regions 70 with the adhesion layer and/or barrier layer.

Conductive material filling the openings can then be formed. The conductive material may be or comprise tungsten, copper, aluminum, gold, silver, alloys thereof, the like, or a combination thereof, and may be deposited by CVD, ALD, PVD, or another deposition technique. After the conductive material is deposited, excess conductive material may be removed by using a planarization process, such as a CMP, for example. The planarization process may remove excess conductive material, barrier layer, and adhesion layer from above the top surface of the one or more dielectric layers 80. Hence, top surfaces of the conductive material, barrier layer, adhesion layer, and one or more dielectric layers 80 may be coplanar. Accordingly, conductive features 110 including the conductive material, barrier layer, adhesion layer, and/or silicide regions may be formed to the epitaxy source/drain regions 70.

FIGS. 14A, 14B, 14C, 14D, and 14E illustrate the formation of one or more dielectric layers 120 and conductive features 122 in the one or more dielectric layers 120. The one or more dielectric layers 120 may include an etch stop layer (ESL) and an interlayer dielectric (ILD) or intermetallization dielectric (IMD), for example. The etch stop layer may be deposited over the one or more dielectric layers 80, conductive features 110 in the one or more dielectric layers 80, gate cut-fill structures 104, etc. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric or intermetal dielectric may be deposited over the etch stop layer. The interlayer dielectric or intermetal dielectric may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The interlayer dielectric or intermetal dielectric may be deposited by spin-on, CVD, FCVD, PECVD, PVD, or another deposition technique.

Recesses and/or openings can be formed in and/or through the one or more dielectric layers 120 where the conductive features 122 are to be formed. The one or more dielectric layers 120 may be patterned with the recesses and/or openings, for example, using photolithography and one or more etching processes. The conductive features 122 may then be formed in the recesses and/or openings. The conductive features 122 may include a barrier layer and conductive material formed on the barrier layer, for example. The barrier layer can be conformally deposited in the recesses and/or openings and over the one or more dielectric layers 120. The barrier layer may be or comprise titanium nitride, titanium oxide, tantalum nitride, tantalum oxide, the like, or a combination thereof, and may be deposited by ALD, CVD, or another deposition technique. The conductive material may be or comprise tungsten, copper, aluminum, gold, silver, alloys thereof, the like, or a combination thereof, and may be deposited by CVD, ALD, PVD, or another deposition technique. After the material of the conductive features 122 is deposited, excess material may be removed by using a planarization process, such as a CMP, for example. The planarization process may remove excess material of the conductive features 122 from above a top surface of the one or more dielectric layers 120. Hence, top surfaces of the conductive features 122 and the one or more dielectric layers 120 may be coplanar. The conductive features 122 may be or may be referred to as conductive lines, contacts, vias, etc. As illustrated, the conductive features 122 are formed to the conductive features 110 formed in the one or more dielectric layers 80 or replacement gate structures to electrically couple the epitaxy source/drain regions 70 or the replacement gate structures, respectively. The layout of the conductive features in the figures is merely an example. A person having ordinary skill in the art will readily understand that a layout of conductive features can differ between different implementations.

FIG. 15 illustrates a top view of an example cut opening 102 in accordance with some embodiments. For example, FIG. 15 illustrates a top view of a cut opening 102 of FIG. 11E. In a plane parallel to the top surface of, e.g., the one or more dielectric layers 80, the cut opening 102 has different widths at different materials or components that the cut opening 102 intersects. For example, in the illustrated cut opening 102, the cut opening 102 has smallest widths A (in a plane at the top surface of the one or more dielectric layers 80) where the cut opening 102 intersects gate spacers 66. Further, in the illustrated cut opening 102, the cut opening 102 has largest widths B (in a plane at the top surface of the one or more dielectric layers 80) at the primary portions of the cut opening 102 where the cut opening 102 intersects gate electrodes 92. Similarly, in the illustrated cut opening 102, the cut opening 102 has medium widths C (in a plane at the top surface of the one or more dielectric layers 80), e.g., larger than the smallest widths A and less than the largest widths B, at the intermediate portion where the cut opening 102 intersects the one or more dielectric layers 80 (e.g., the ILD).

As described above with respect to FIGS. 11A through 11E, the isotropic etching process that is used to form the cut opening 102 can have different etch rates for different materials of the structure being etched. The gate spacers 66, and possibly, the gate dielectric layer 90, are etched during the isotropic etching process at a first etch rate ER1. The one or more dielectric layers 80 are etched during the isotropic etching process at a second etch rate ER2. The gate electrode 92, and possibly, one or more optional conformal layers 91, are etched during the isotropic etching process at a third etch rate ER3. The first etch rate ER1 is less than the second etch rate ER2, and the second etch rate ER2 is less than the third etch rate ER3. The smallest widths A may occur due to the first etch rate ER1 during the isotropic etching (e.g., the etch rate of the gate spacers 66, and possibly, the gate dielectric layer 90) being lower than the second etch rate ER2 and the third etch rate ER3. The largest widths B may occur due to the third etch rate ER3 during the isotropic etching (e.g., the etch rate of the gate electrode 92, and possibly, one or more optional conformal layers 91) being greater than the first etch rate ER1 and the second etch rate ER2. The medium widths C may occur due to second etch rate ER2 during the isotropic etching (e.g., the etch rate of the one or more dielectric layers 80) being less than the third etch rate ER3 and greater than the first etch rate ER1.

The proximity of different materials of different components can cause the different widths A, B, and C and can cause curved surfaces of the cut opening 102 between the widths A, B, and C (e.g., curved convex surfaces of the intermediate and primary portions). Lateral etching components of the isotropic etching of the etching process may be reduced near the gate spacers 66 where the first etch rate ER1 of the isotropic etching is the lowest because the lower first etch rate ER1 of the gate spacers 66 may cause a rate of exposure of adjoining materials to the isotropic etching of the etching process to be reduced. This can cause the isotropic etching to cause a "bulge" in the primary portions (e.g., at width B) at the respective midlines of the gate electrodes 92. Similarly, this can cause the isotropic etching of the etching process to cause another "bulge" in the intermediate portion (e.g., at width C) in the one or more dielectric layers 80 at a midway between neighboring gate spacers 66, for example.

In some examples, a ratio of the largest width B to the smallest width A is in a range from about 2.5:1 to about 1.5:1; a ratio of the medium width C to the smallest width A is in a range from about 2:1 to about 1.2:1; and a ratio of the largest width B to the medium width C is in a range from about 2.5:1 to about 1.4:1. In some examples, the smallest width A is in a range from about 5 nm to about 22 nm; the medium width C is in a range from about 5 nm to about 28 nm; and the largest width B is in a range from about 12 nm to about 28 nm.

Although the examples of FIG. 15 and subsequent figures are illustrated and described in the context of certain components having certain features, other embodiments may have other and/or additional components that have those and/or additional features. For example, some embodiments can include an etch stop layer that has a lowest etch rate during the isotropic etching of the etching process. In other examples, the gate dielectric layer 90 may have a lowest etch rate during the isotropic etching of the etching process. In these examples, the widths of the cut opening may vary from the illustrated cut opening 102 in FIG. 15.

Figure 16:
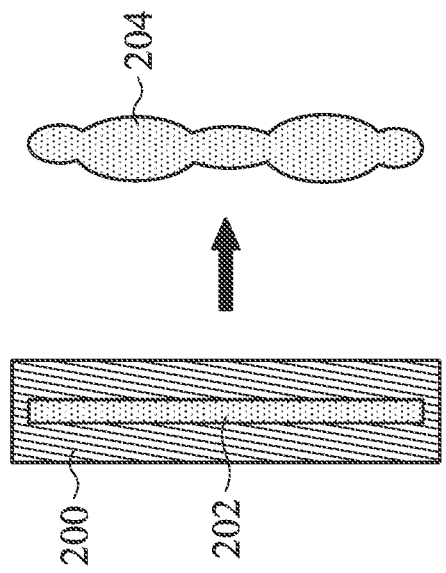
FIG. 16 is a top view of an example mask with a mask opening for an example etching process in accordance with some embodiments.

FIG. 16 illustrates a top view of an example mask 200 with a mask opening 202 corresponding to a cut opening 204 for the etching process of FIGS. 11A-E in accordance with some embodiments. The mask opening 202 in the mask 200 is rectangular in a plane of the top surface of the mask 200, and can result, in conjunction with the etching process, in the cut opening 204, such as previously described. In other examples, the mask opening 202 in the mask 200 is rectangular with rounded corners or is oval in a plane of the top surface of the mask 200.

Figure 17:
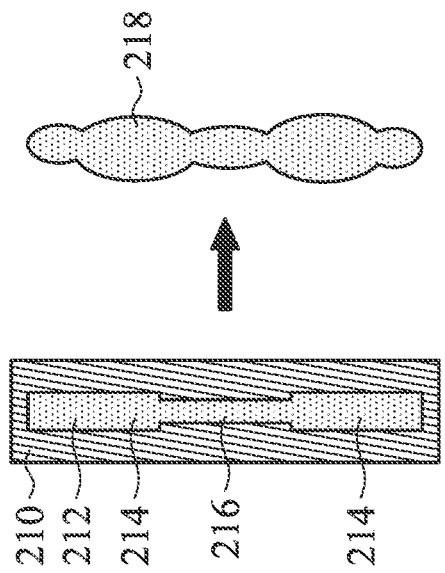
FIG. 17 is a top view of another example mask with a mask opening for an example etching process in accordance with some embodiments.

FIG. 17 illustrates a top view of an example mask 210 with a mask opening 212 corresponding to a cut opening 218 for the etching process of FIGS. 11A-E in accordance with some embodiments. The mask opening 212 in the mask 210 includes end sections 214 and a constricted midsection 216. The end sections 214 in a plane of the top surface of the mask 200 are each rectangular with a width, and the constricted midsection 216 is disposed between the end sections 214 and is rectangular with a width that is less than the width of the end sections 214. The end sections 214 can be positioned directly over gate electrodes 92 that are to be cut by the etching process of FIGS. 11A-E while the constricted midsection 216 can be positioned between epitaxy source/drain regions 70. The mask opening 212 in the mask 210 can result, in conjunction with the etching process, in the cut opening 218, such as previously described. The mask opening 212 in the mask 210 can cause the ratio of the largest widths B to the medium widths C in the cut opening 218 of FIG. 17 to be larger than the ratio of the largest widths B to the medium widths C in the cut opening 204 of FIG. 16.

Figure 18A:
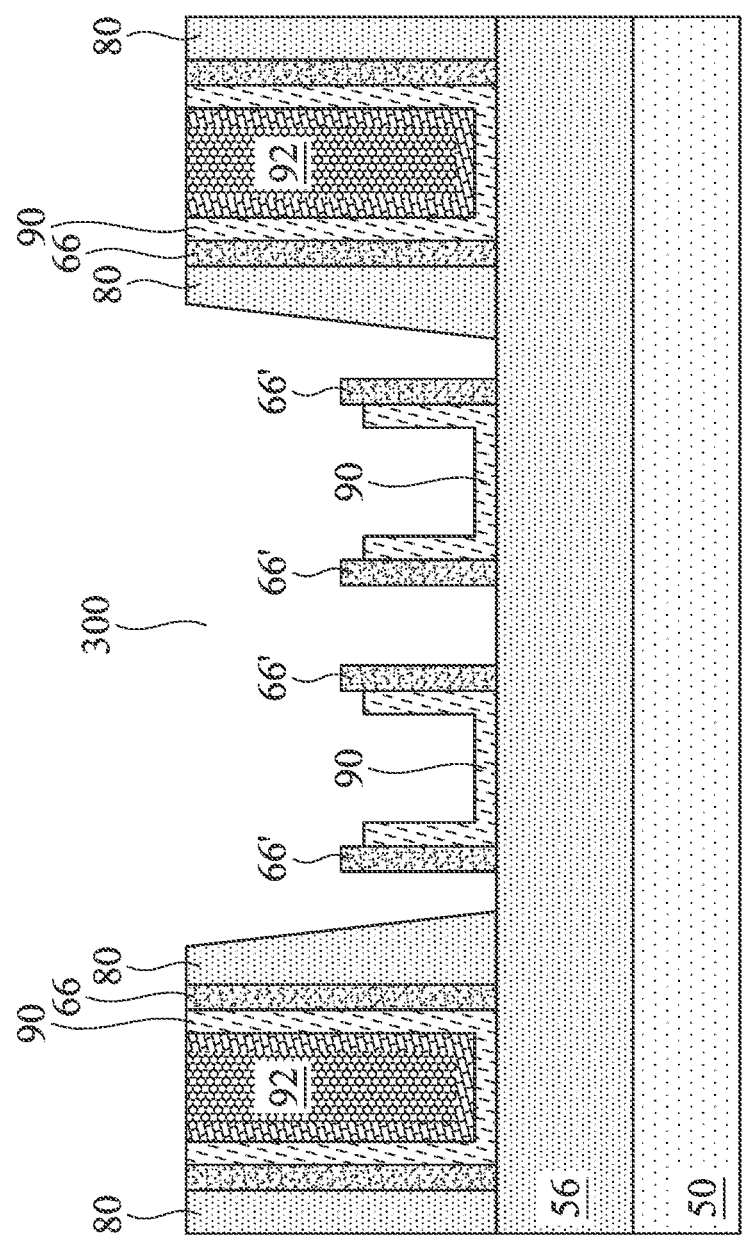
FIGS. 18A-B and 19 are various views of respective intermediate structures at intermediate stages in an example process of forming a semiconductor device including one or more FinFETs in accordance with some embodiments.
Figure 18B:
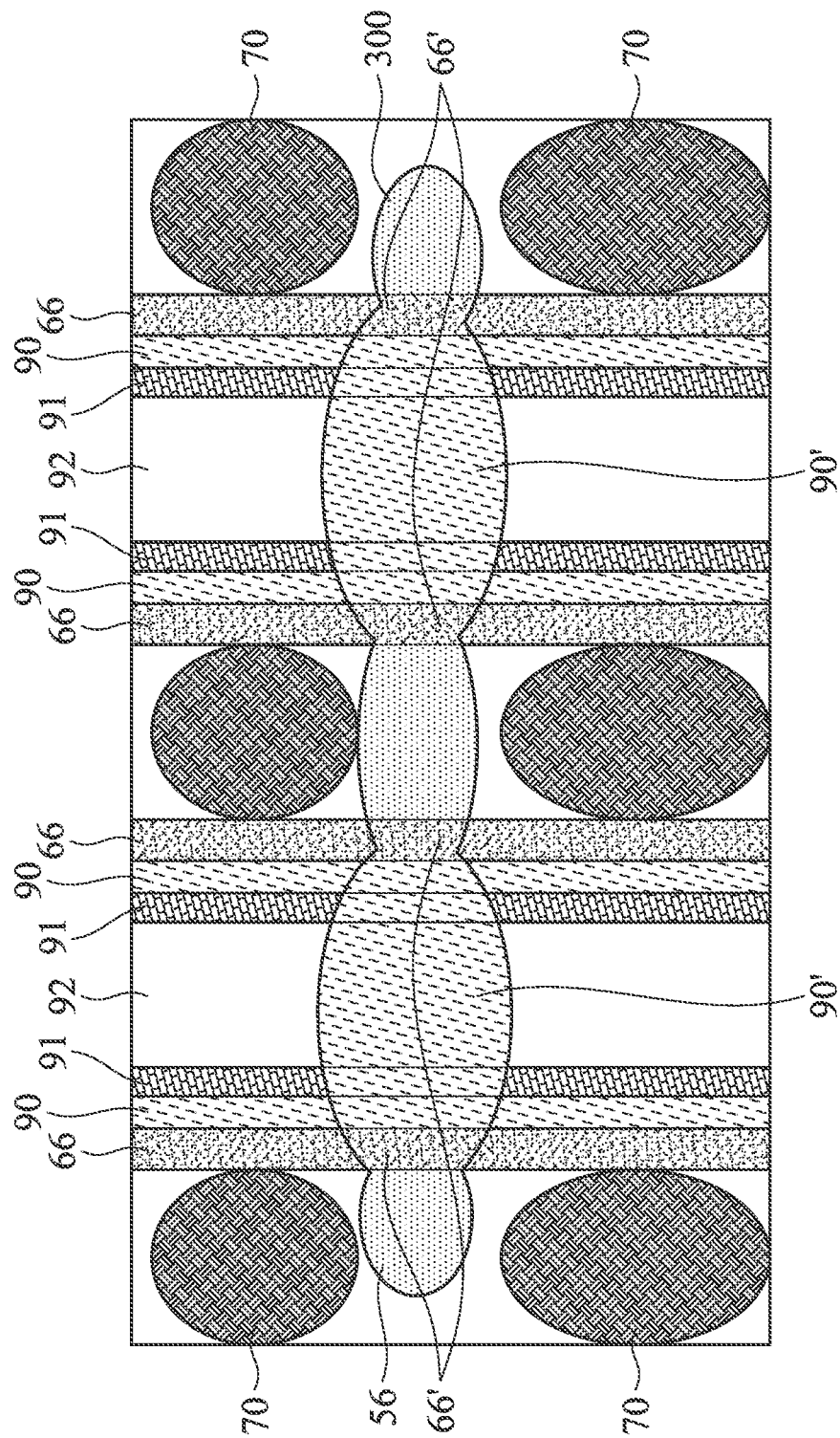
Figure 19:
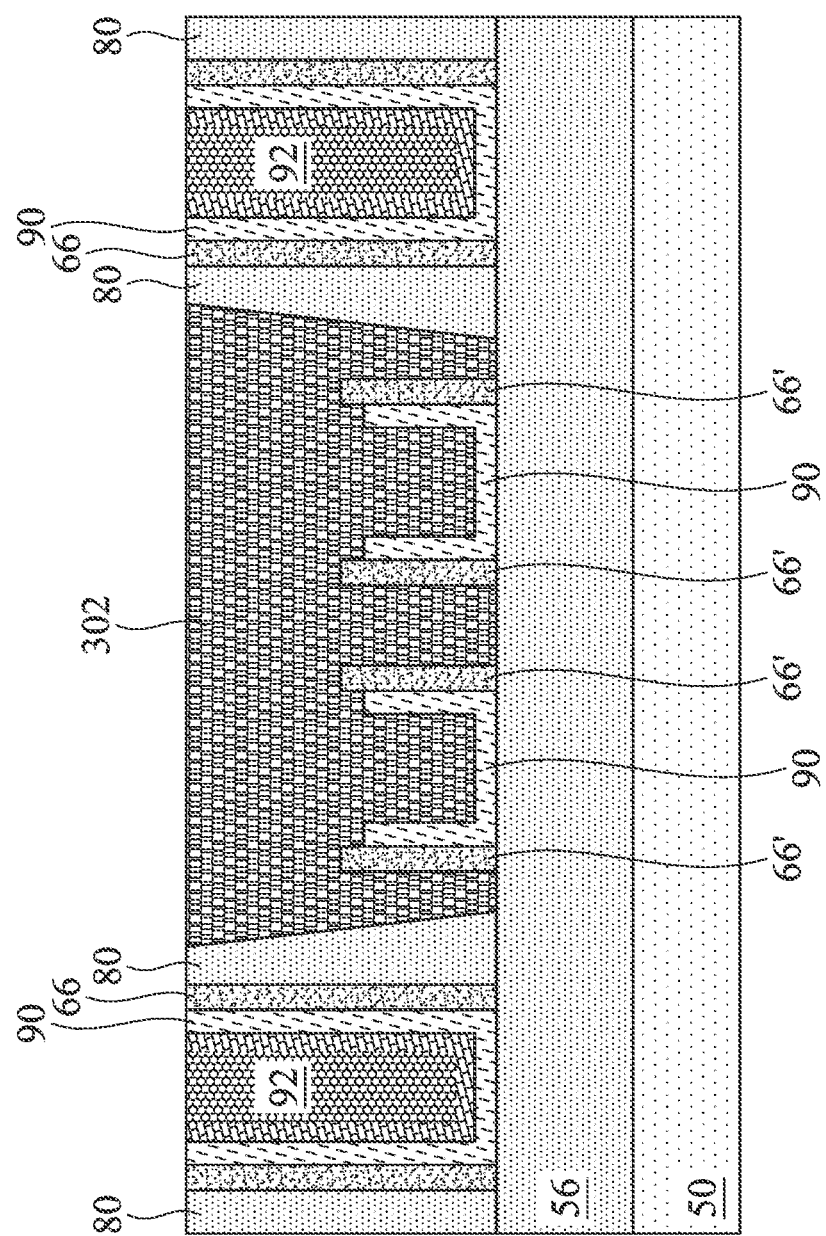

FIGS. 18A and 19 illustrate cross-sectional views, and FIG. 18B illustrates a top view, of an intermediate structure during intermediate stages in an example process of forming a semiconductor device in accordance with some embodiments. In previous examples, such as in FIG. 11B, the etching process removed the gate spacers 66 and the gate dielectric layer 90 within the profile of the cut opening 102, and etched to the isolation region 56 that was directly under those structures. In the illustrated example of FIGS. 18A and 18B, a portion of the gate spacers 66' and a portion of the gate dielectric layer 90' remain within a cut opening 300 after the etching process of FIGS. 11A-11E. In FIGS. 18A and 18B, the gate electrode 92 and any conductive layer of the one or more optional conformal layers 91 are removed from the cut opening 300 to electrically separate or isolate the sections of the gate electrode 92 that was cut by the cut opening 300. The cut opening 300 may have characteristics and features previously described for other cut openings. In the example of FIGS. 18A and 18B, however, the etching process used to form the cut opening 300 may have an etch rate and time that removes the gate electrode 92 and any conductive layer of the one or more optional conformal layers 91 and does not remove the portions of the gate spacers 66' and portion of the gate dielectric layer 90'.

FIG. 19 illustrates the formation of a gate cut-fill structure 302 in the cut opening 300. An insulating material for the gate cut-fill structure 302 is deposited in the cut opening 300 that cut the replacement gate structures. In some examples, the gate cut-fill structure 302 may be a single insulating material, and in other examples, the gate cut-fill structure 302 may include multiple different insulating materials, such as in a multi-layered configuration. The gate cut-fill structure 302 may be formed as described with respect to FIGS. 12A-12E. The gate cut-fill structure 302 therefore electrically isolates sections of the replacement gate structures that were cut from each other. Further, the gate cut-fill structure 302 may encapsulate the portions of the gate spacers 66' and portion of the gate dielectric layer 90' that remain in the cut opening 300.

Figure 20:
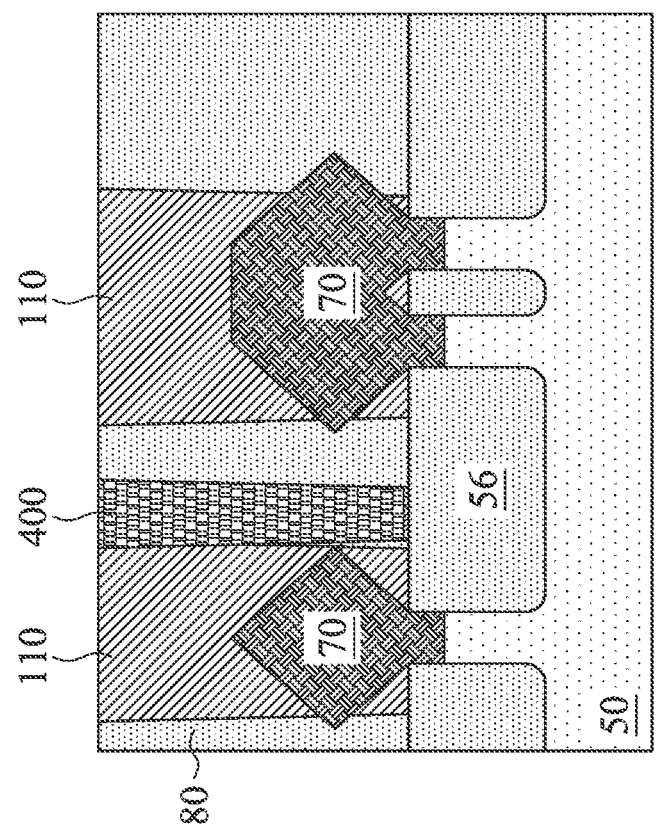
FIG. 20 is a cross-sectional view of a gate cut-fill structure that is misaligned or overlaid with a conductive feature in accordance with some embodiments.

FIG. 20 illustrates a cross-sectional view of a gate cut-fill structure 400 that is misaligned or overlaid with a conductive feature 110 in accordance with some embodiments. The gate cut-fill structure 400 may be formed according to the formation of the gate cut-fill structure 104 in FIGS. 1 through 13A-E. The cross-section of FIG. 20 corresponds with the cross-section of FIG. 13C, for example. With respect to FIG. 20, the mask opening in the mask that is used to etch the cut opening for the gate cut-fill structure 400 may be misaligned between the epitaxy source/drain regions 70. This can result in a conductive feature 110 being formed in direct contact with the gate cut-fill structure 400. This contact between the conductive feature 110 and the gate cut-fill structure 400 may, in some instances, not affect the operability of the device since the gate cut-fill structure 400 is an insulating structure.

Figure 21:
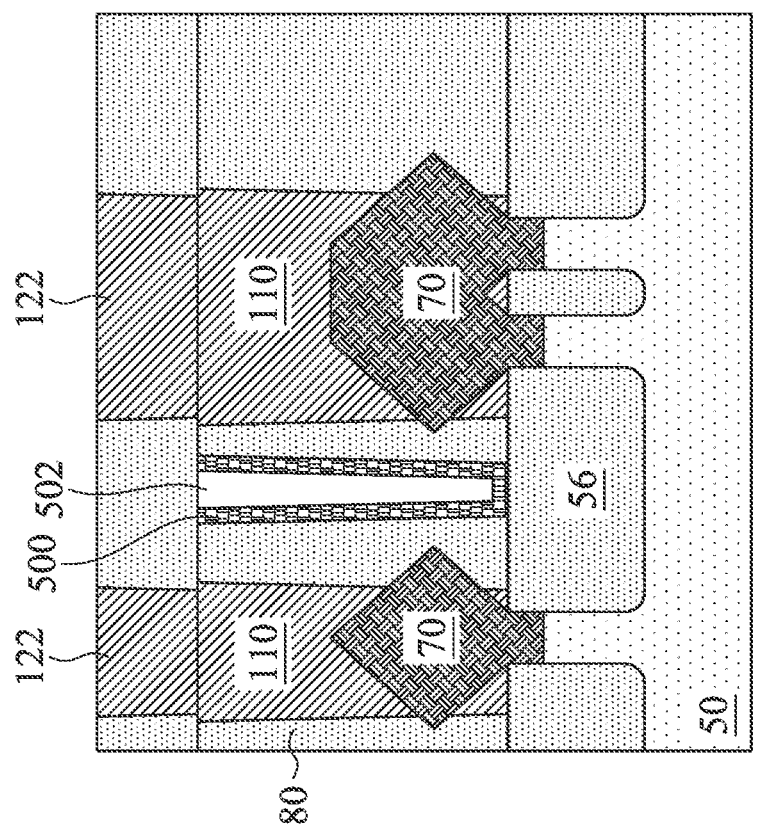
FIG. 21 is a cross-sectional view of a gate cut-fill structure that includes a void in accordance with some embodiments.
Figure 23:
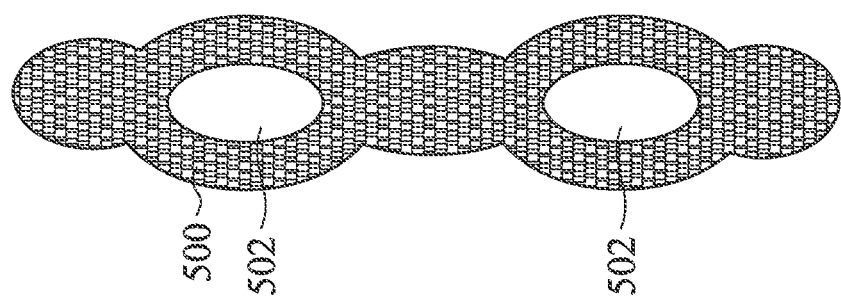
FIG. 23 is a layout view of another gate cut-fill structure that includes a void in accordance with some embodiments.
Figure 22:
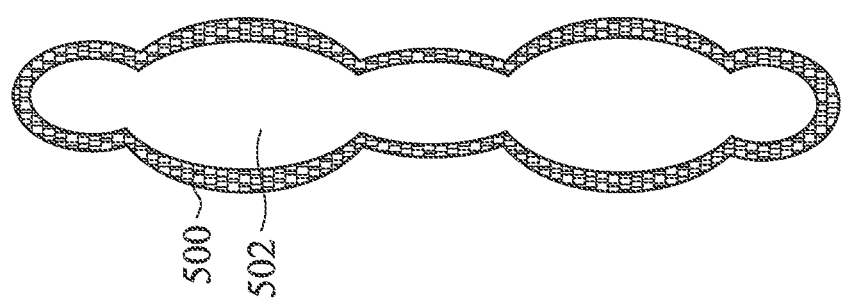
FIG. 22 is a layout view of a gate cut-fill structure that includes a void in accordance with some embodiments.

FIG. 21 illustrates a cross-sectional view of a gate cut-fill structure that includes a void 502 in accordance with some embodiments. In previously described embodiments, the gate cut-fill structures are completely filled with one or more solid insulating material. In other embodiments, such as illustrated in FIG. 21, the gate cut-fill structure includes a void 502, which may be a vacuum or include a gas. The gate cut-fill structure also includes an insulating liner 500 that is conformal in the cut opening. The void 502 may extend substantially the length of the cut opening (e.g., through the length except for portions at ends where a thickness of the insulating liner 500 is on the respective sidewall of the cut opening), as illustrated in a layout view in FIG. 22. In other examples, one or more voids 502 may be at various locations in the insulating liner 500, and the insulating liner 500 may separate multiple voids 502. For example, as illustrated in a layout view in FIG. 23, wider portions of a gate cut-fill structure, such as the primary portions, have a void 502, while narrower portions of the gate cut-fill structure are filled with the insulating liner 500. Further, in some devices, different gate cut-fill structures may have differing corresponding widths, and hence, some gate cut-fill structures may have voids, such as illustrated in FIGS. 22 and 23, while other gate cut-fill structures may be filled with a solid insulating material.

Figure 25:
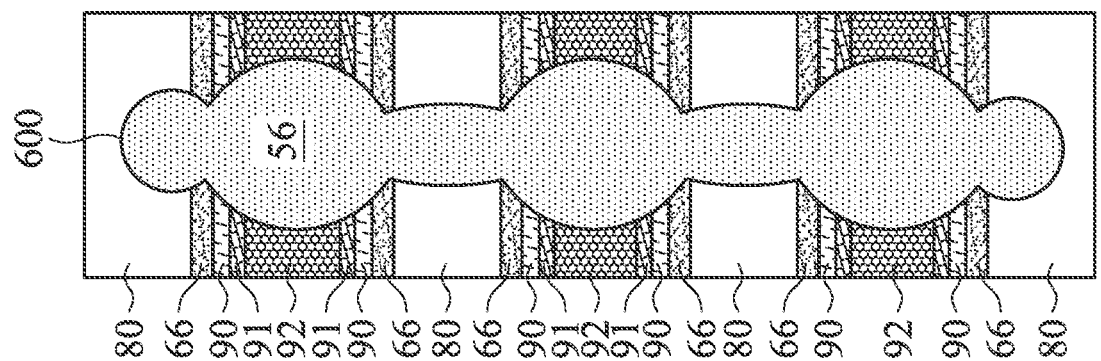
FIG. 25 is a top view of a cut opening that cuts three replacement gate structures in accordance with some embodiments.
Figure 24:
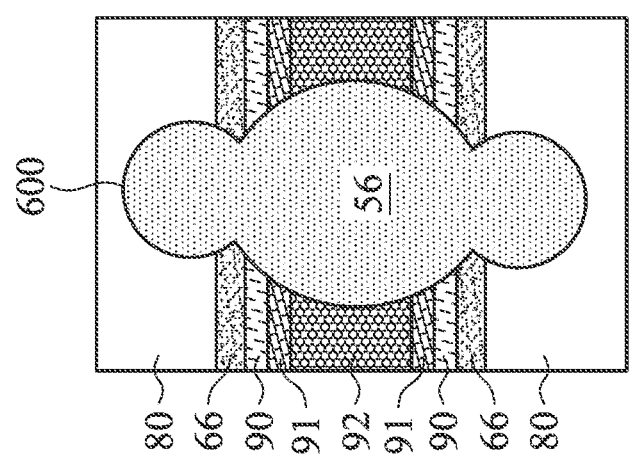
FIG. 24 is a top view of a cut opening that cuts one replacement gate structure in accordance with some embodiments.

Embodiments described previously have been described in the context of a cut opening cutting two neighboring replacement gate structures. In other embodiments, any number of replacement gate structures can be cut by a cut opening. For example, FIG. 24 illustrates in a top view a cut opening 600 that cuts one replacement gate structure (e.g., including one gate electrode 92). Further, FIG. 25 illustrates in a top view a cut opening 602 that cuts three replacement gate structures (e.g., each including one gate electrode 92). From the various illustrated embodiments, a person having ordinary skill in the art will readily understand a pattern that may be repeated by a cut opening extending through multiple replacement gate structures. The cut openings 600 and 602 may be formed as previously described, for example, with a mask opening through a mask intersecting the appropriate replacement gate structures to be cut, and subsequently, performing an etching process to cut those replacement gate structures.

Some embodiments may achieve advantages. For example, a cut opening can have a width between neighboring epitaxy source/drain regions that is less than a width between sections of a gate structure that has been cut. This can permit the cut opening to be spaced at a greater distance from the epitaxy source/drain regions while permitting sufficient etching of the gate structure. The greater distance between the cut opening and epitaxy source/drain regions can reduce a risk that the epitaxy source/drain regions are damaged during the etching process that forms the cut opening. This can increase the yield of structures formed with a gate cut process. Further, the formation, and resulting profile, of a cut opening can increase a process window for forming a conductive feature to a neighboring epitaxy source/drain region, and/or can increase the pattern density of the device.

An embodiment is a structure. The structure includes a first active area on a substrate, a first gate structure over the first active area, a second gate structure over the first active area, and a gate cut-fill structure. The first active area includes a first source/drain region. The first gate structure extends longitudinally parallel to the second gate structure, and the first source/drain region is disposed laterally between the first gate structure and the second gate structure. The gate cut-fill structure has a first primary portion, a second primary portion, and a first intermediate portion. The first primary portion abuts the first gate structure. The second primary portion abuts the second gate structure. The first intermediate portion extends laterally from the first primary portion to the second primary portion. The first primary portion has a first width, and the first width is along a longitudinal midline of the first gate structure. The second primary portion has a second width, and the second width is along a longitudinal midline of the second gate structure. The first intermediate portion has a third width, and the third width is midway between the first gate structure and the second gate structure and is parallel to the longitudinal midline of the first gate structure. The first width is greater than the third width, and the second width is greater than the third width.

Another embodiment is a method. A first gate structure and a second gate structure are formed over a first active area and a second active area on a substrate. The first gate structure extends longitudinally over the first active area and the second active area, and the second gate structure extends longitudinally over the first active area and the second active area. A dielectric layer is disposed laterally between the first gate structure and the second gate structure and over the first active area and the second active area. A cut opening is formed laterally disposed between the first active area and the second active area. The cut opening has a first primary portion, a second primary portion, and an intermediate portion. The first primary portion is through at least a gate electrode of the first gate structure. The second primary portion is through at least a gate electrode of the second gate structure. The intermediate portion extends laterally from the first primary portion to the second primary portion and is in the dielectric layer. The first primary portion has a first width, and the first width is along a longitudinal midline of the first gate structure. The second primary portion has a second width, and the second width is along a longitudinal midline of the second gate structure. The intermediate portion has a third width, and the third width is midway between the first gate structure and the second gate structure and is parallel to the longitudinal midline of the first gate structure. The first width is greater than the third width, and the second width is greater than the third width. A gate cut-fill structure is formed in the cut opening.

A further embodiment is a method. A first gate structure and a second gate structure are formed over a first active area and a second active area on a substrate. The first gate structure extends longitudinally over the first active area and the second active area, and the second gate structure extends longitudinally over the first active area and the second active area. A dielectric layer is disposed laterally between the first gate structure and the second gate structure and over the first active area and the second active area. An etch process is performed on the first gate structure, the second gate structure, and the dielectric layer laterally between the first active area and the second active area to form a cut opening. The etch process etches through at least gate electrodes of the first gate structure and the second gate structure. The etch process includes an isotropic etch. The isotropic etch etches the gate electrodes of the first gate structure and the second gate structure at a first etch rate. The isotropic etch etches the dielectric layer at a second etch rate. The first etch rate is greater than the second etch rate. An insulating material is formed in the cut opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first fin protruding from a substrate;
   a second fin protruding from the substrate;
   a first gate structure extending over the first fin;
   a second gate structure extending over the second fin, the first gate structure and the second gate structure being longitudinally aligned;
   a first gate spacer along a sidewall of the first gate structure;
   a second gate spacer along a sidewall of the second gate structure; and
   a gate cut-fill structure interposed between the first gate structure and the second gate structure, the gate cut-fill structure being interposed between the first gate spacer and the second gate spacer, wherein a first width of the gate cut-fill structure between the first gate spacer and the second gate spacer is less than a second width of the gate cut-fill structure between the first gate structure and the second gate structure.

2. The structure of claim 1 further comprising:
   a first source/drain region over the first fin and adjacent the first gate structure; and
   a second source/drain region over the second fin and adjacent the second gate structure, wherein the gate cut-fill structure is interposed between the first source/drain region and the second source/drain region, wherein a third width of the gate cut-fill structure between the first source/drain region and the second source/drain region is greater than the first width.

3. The structure of claim 2, wherein the first source/drain region and the second source/drain region are epitaxial regions.

4. The structure of claim 3, wherein a distance between the first source/drain region and the gate cut-fill structure is in a range from 5 nm to 15 nm.

5. The structure of claim 4, wherein a distance between the second source/drain region and the gate cut-fill structure is in a range from 5 nm to 15 nm.

6. The structure of claim 1 further comprising:
   isolation regions interposed between the first fin and the second fin, wherein the first fin and the second fin protrude above the isolation regions, wherein the gate cut-fill structure extends to the isolation regions.

7. The structure of claim 6, wherein the gate cut-fill structure comprises:
   a dielectric material layer along sidewalls of the first gate structure and the second gate structure; and a void in the dielectric material layer, wherein the dielectric material layer completely separates the void from the isolation regions.

8. A structure comprising:
a first gate structure and a second gate structure extending along a first line;
a third gate structure and a fourth gate structure extending along a second line;
a first gate spacer along a sidewall of the first gate structure;
a second gate spacer along a sidewall of the second gate structure;
a third gate spacer along a sidewall of the third gate structure;
a fourth gate spacer along a sidewall of the fourth gate structure;
a first source/drain region interposed between the first gate structure and the third gate structure;
a second source/drain region interposed between the second gate structure and the fourth gate structure;
a first dielectric layer over the first source/drain region and the second source/drain region; and
a gate cut-fill structure interposed between the first gate structure and the second gate structure, the gate cut-fill structure being interposed between the first gate spacer and the second gate spacer, the gate cut-fill structure being interposed between the third gate spacer and the fourth gate spacer, the gate cut-fill structure extending through the first dielectric layer interposed between the first source/drain region and the second source/drain region, wherein a width of the gate cut-fill structure extending through the first dielectric layer is less than a width of the gate cut-fill structure interposed between the first gate structure and the second gate structure, wherein the width of the gate cut-fill structure extending through the first dielectric layer is less than a width of the gate cut-fill structure interposed between the third gate structure and the fourth gate structure.

9. The structure of claim 8, wherein the first gate structure and the third gate structure extends over a first fin, and wherein the second gate structure and the fourth gate structure extends over a second fin.

10. The structure of claim 8, wherein:
a width of the gate cut-fill structure interposed between the first gate spacer and the second gate spacer is less than the width of the gate cut-fill structure extending through the first dielectric layer between the first source/drain region and the second source/drain region,
the width of the gate cut-fill structure interposed between the first gate spacer and the second gate spacer is less than the width of the gate cut-fill structure interposed between the first gate structure and the second gate structure, and
the width of the gate cut-fill structure interposed between the first gate spacer and the second gate spacer is less than the width of the gate cut-fill structure interposed between the third gate structure and the fourth gate structure.

11. The structure of claim 8 further comprising a second dielectric layer extending over the first dielectric layer and over the gate cut-fill structure.

12. The structure of claim 11, wherein the gate cut-fill structure comprises:
a third dielectric layer along sidewalls of the first gate structure, the second gate structure, the third gate structure and the fourth gate structure; and
a first void interposed between the first gate structure and the second gate structure, wherein the second dielectric layer forms an upper surface of the first void.

13. The structure of claim 12, wherein the gate cut-fill structure further comprises:
a second void interposed between the third gate structure and the fourth gate structure, wherein the first dielectric layer separates the first void and the second void.

14. The structure of claim 12, wherein the first void extends continuously between the first source/drain region and the second source/drain region, wherein the first void extends continuously between the third gate structure and the fourth gate structure.

15. A structure comprising:
a first fin protruding from a substrate;
a second fin protruding from the substrate;
a first gate electrode extending over the first fin;
a second gate electrode extending over the second fin, the first gate electrode and the second gate electrode being longitudinally aligned;
a first gate spacer along a first sidewall of the first gate electrode and along a first sidewall of the second gate electrode;
a second gate spacer along a second sidewall of the first gate electrode and along a second sidewall of the second gate electrode; and
a gate cut-fill structure interposed between the first gate electrode and the second gate electrode, the gate cut-fill structure extending over an upper surface of the first gate spacer and the second gate spacer.

16. The structure of claim 15 further comprising a gate dielectric interposed between the first gate electrode and the first fin and interposed between the second gate electrode and the second fin, the gate dielectric extending continuously between the first gate electrode to the second gate electrode.

17. The structure of claim 16, wherein an upper surface of the first gate spacer below the gate cut-fill structure is higher than an upper surface of the gate dielectric below the gate cut-fill structure.

18. The structure of claim 15, wherein the gate cut-fill structure is interposed between the first gate spacer and the second gate spacer.

19. The structure of claim 15, wherein a first width of the gate cut-fill structure directly over the first gate spacer is less than a second width of the gate cut-fill structure between the first gate electrode and the second gate electrode.

20. The structure of claim 15, wherein the gate cut-fill structure directly contacts opposite sidewalls of the first gate spacer.

* * * * *